(12) United States Patent
Du et al.

(10) Patent No.: US 11,854,887 B2
(45) Date of Patent: Dec. 26, 2023

(54) NITRIDE-BASED SEMICONDUCTOR DEVICES WITH RECESSES FOR DICING AND METHODS OF FABRICATING THE SAME

(71) Applicant: INNOSCIENCE (ZHUHAI) TECHNOLOGY CO., LTD., Zhuhai (CN)

(72) Inventors: Weixing Du, Zhuhai (CN); Yulong Zhang, Zhuhai (CN); Jue Ouyang, Zhuhai (CN); Minghong Chang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 112 days.

(21) Appl. No.: 16/767,123

(22) PCT Filed: Apr. 10, 2020

(86) PCT No.: PCT/CN2020/084167
§ 371 (c)(1),
(2) Date: May 27, 2020

(87) PCT Pub. No.: WO2021/203407
PCT Pub. Date: Oct. 14, 2021

(65) Prior Publication Data
US 2022/0122885 A1    Apr. 21, 2022

(51) Int. Cl.
| H01L 23/31 | (2006.01) |
| H01L 21/78 | (2006.01) |
| H01L 29/06 | (2006.01) |
| H01L 21/3213 | (2006.01) |
| H01L 23/58 | (2006.01) |
| G03F 7/20 | (2006.01) |

(52) U.S. Cl.
CPC .......... *H01L 21/78* (2013.01); *H01L 23/3171* (2013.01); *H01L 23/3185* (2013.01);
(Continued)

(58) Field of Classification Search
CPC ............. H01L 21/78; H01L 21/782–84; G03F 7/2022–2026; G03F 7/20; G03F 7/22
See application file for complete search history.

(56) References Cited

U.S. PATENT DOCUMENTS

2007/0293019 A1    12/2007   Jeng et al.
2009/0200568 A1*   8/2009    Horie ................. H01L 33/02
                                                          438/34
(Continued)

FOREIGN PATENT DOCUMENTS

CN    101641776 A    2/2010
CN    102593076 A    7/2012
(Continued)

OTHER PUBLICATIONS

International Search Report and Written Opinion of the corresponding PCT application No. PCT/CN2020/084167 dated Jan. 12, 2021.
(Continued)

*Primary Examiner* — Marcos D. Pizarro
*Assistant Examiner* — William Henry Anderson
(74) *Attorney, Agent, or Firm* — McCoy Russell LLP

(57) ABSTRACT

The present disclosure provides a semiconductor device and a fabrication method thereof. The semiconductor device includes a substrate, a group III-V layer disposed on the substrate, a dielectric layer disposed on the group III-V layer, and an inclined sidewall extending from the dielectric layer to the substrate. Wherein the substrate comprising a relative rough surface opposite the inclined sidewall.

6 Claims, 23 Drawing Sheets

(52) U.S. Cl.
   CPC ........ *H01L 29/0657* (2013.01); *G03F 7/2022* (2013.01); *H01L 21/32139* (2013.01); *H01L 23/585* (2013.01)

(56) References Cited

U.S. PATENT DOCUMENTS

| | | |
|---|---|---|
| 2009/0278236 A1 | 11/2009 | Sato et al. |
| 2010/0112811 A1 | 5/2010 | Yeh et al. |
| 2017/0212423 A1* | 7/2017 | Yu .............................. G03F 7/22 |
| 2017/0256638 A1 | 9/2017 | Macelwee et al. |
| 2018/0012770 A1 | 1/2018 | Macelwee et al. |
| 2018/0033695 A1* | 2/2018 | Chang ................... H01L 21/268 |
| 2018/0138368 A1* | 5/2018 | Jang ....................... H01L 33/405 |
| 2018/0337308 A1* | 11/2018 | Chong .................... H01L 33/46 |
| 2020/0135564 A1* | 4/2020 | Zundel .................. H01L 21/049 |

FOREIGN PATENT DOCUMENTS

| | | |
|---|---|---|
| CN | 109256375 A | 1/2019 |
| CN | 109478584 A | 3/2019 |

OTHER PUBLICATIONS

State Intellectual Property Office of the People's Republic of China, Office Action and Search Report Issued in Application No. 202080000992.1, dated Feb. 21, 2023, 24 pages. (Submitted with Partial Translation).

\* cited by examiner

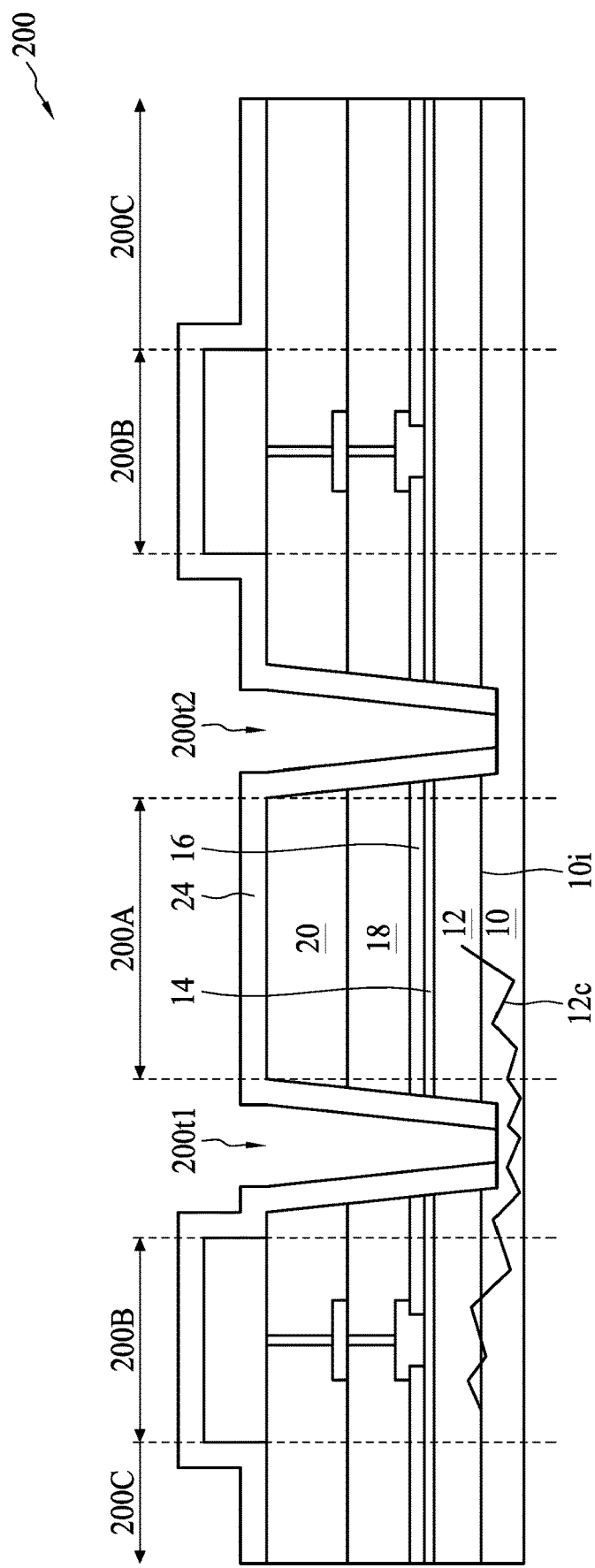

NITRIDE-BASED SEMICONDUCTOR DEVICES WITH RECESSES FOR DICING AND METHODS OF FABRICATING THE SAME

BACKGROUND

1. Technical Field

The present disclosure relates to semiconductor devices and methods of fabricating the same, and more particularly to semiconductor devices having a group III-V layer.

2. Description of the Related Art

A semiconductor component, which includes direct bandgap semiconductor material(s) (e.g. group III-V materials or group III-V compounds (Category: III-V compounds), can operate or work under various conditions (e.g., at different voltages and frequencies) due to its nature.

Such semiconductor component may include a heterojunction bipolar transistor (HBT), a heterojunction field effect transistor (HFET), a high-electron-mobility transistor (HEMT), a modulation-doped FET (MODFET) and the like.

Gallium nitride (GaN) is a compound of nitrogen and gallium, and is an III-V material that may be used in manufacturing an III-V semiconductor component. The III-V semiconductor component can have better electronic properties in terms of saturation electron velocity, high electron mobility, etc.

SUMMARY OF THE INVENTION

In some embodiments of the present disclosure, a semiconductor device is provided. The semiconductor device includes a substrate, a group III-V layer disposed on the substrate, a dielectric layer disposed on the group III-V layer, and an inclined sidewall extending from the dielectric layer to the substrate. Wherein the substrate comprising a relative rough surface opposite the inclined sidewall.

In some embodiments of the present disclosure, a semiconductor structure is provided. The semiconductor structure comprises a substrate; a group III-V layer disposed on the substrate; and a dielectric layer disposed on the group III-V layer. The semiconductor structure comprises a first sidewall extending from the dielectric layer into the substrate; and a second sidewall disposed opposite the first sidewall and extending from the dielectric layer into the substrate, wherein the first sidewall and the second sidewall define a recess.

In some embodiments of the present disclosure, a method for manufacturing a semiconductor device is provided. The method includes providing a semiconductor structure having a substrate, a group III-V layer and a dielectric layer. The method includes forming a recess extending from the dielectric layer to the substrate and forming a metal layer covering the dielectric layer and the recess. The method includes forming a photoresist layer on the metal layer. The method includes performing a first photolithography process and a second photolithography process on the photoresist layer. The focus setting of the first photolithography process is different from the focus setting of the second photolithography process.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 2A, FIG. 2B, FIG. 2C, FIG. 2D, FIG. 2E, FIG. 2F, FIG. 2G, FIG. 2H, FIG. 2I-1 and FIG. 2J-1 illustrate a method of manufacturing a semiconductor structure according to some embodiments of the present disclosure.

FIG. 2A, FIG. 2B, FIG. 2C, FIG. 2D, FIG. 2E, FIG. 2F, FIG. 2G, FIG. 2H, FIG. 2I-2 and FIG. 2J-2 illustrate a method of manufacturing a semiconductor structure according to some embodiments of the present disclosure.

FIG. 4B is a simplified schematic cross-sectional view of a portion of a semiconductor wafer according to certain comparative embodiments of the present disclosure.

PREFERRED EMBODIMENT OF THE PRESENT INVENTION

Figure 1A:
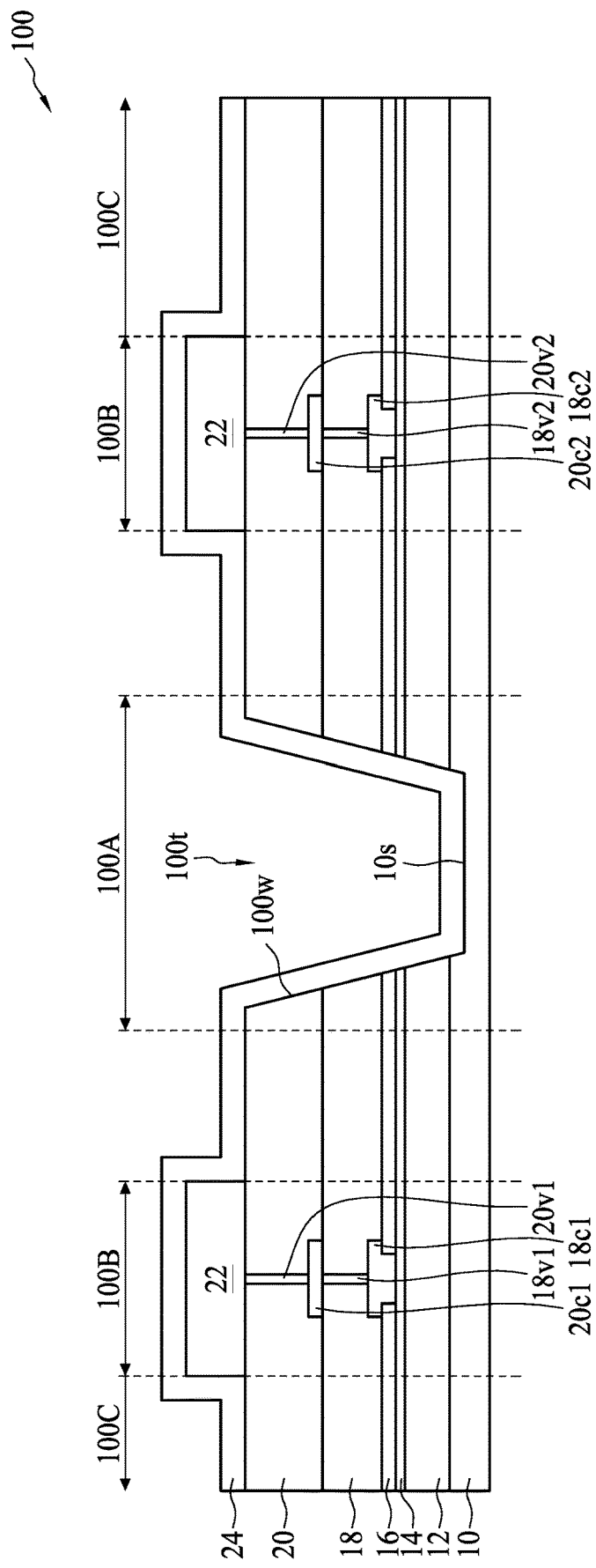
FIG. 1A is a simplified schematic cross-sectional view of a portion of a semiconductor wafer according to certain embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Direct bandgap materials, such as group III-V compounds, may include, but are not limited to, for example, gallium arsenide (GaAs), indium phosphide (InP), gallium nitride (GaN), indium gallium arsenide (InGaAs), aluminum gallium arsenide (InAlAs), and others.

FIG. 1A is a simplified schematic cross-sectional view of a portion of a semiconductor wafer according to certain embodiments of the present disclosure.

FIG. 1A shows a semiconductor structure 100 according to certain embodiments of the present disclosure. As shown in FIG. 1A, the semiconductor structure 100 includes a substrate 10, group III-V layers 12 and 14, dielectric layers 16, 18 and 20, a metal layer 22 and a passivation layer 24. The semiconductor structure 100 further includes a recess 100t. In some embodiments, the recess 100t can also be referred to as a trench.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials. In some embodiments, the substrate 10 may further include a doped region (not shown in FIG. 1A), for example, a p-well, n-well, or the like.

The group III-V layers 12 and 14 can be disposed on the substrate 10. The group III-V layers 12 and 14 can be stacked on the substrate 10. In some embodiments, group III-V layers 12 and 14 can be doped group III-V layers. In some embodiments, the semiconductor structure 100 may include more than two group III-V layers. In some embodiments, the semiconductor structure 100 may include only one group III-V layer.

The group III-V layers 12 and 14 may include, without limitation, for example, doped gallium nitride (doped GaN), doped aluminum gallium nitride (doped AlGaN), doped indium gallium nitride (doped InGaN), and other doped III-V compounds. The group III-V layers 12 and 14 may include, without limitation, for example, a p-type dopant, an n-type dopant, or other dopants. In some embodiments, exemplary dopants can include, for example, but are not limited to, magnesium (Mg), zinc (Zn), cadmium (Cd), silicon (Si), germanium (Ge), and the like.

Dielectric layers 16, 18 and 20 may include, without limitation, for example, an oxide or a nitride, such as silicon nitride (SiN), silicon oxide ($SiO_2$), and the like. The dielectric layers 16, 18 and 20 can include, for example, without limitation, a composite layer of an oxide and a nitride, such as $Al_2O_3$/SiN, $Al_2O_3$/$SiO_2$, AlN/SiN, AlN/$SiO_2$, and the like.

In some embodiments, the semiconductor structure 100 may include more than three dielectric layers. In some embodiments, the semiconductor structure 100 may include only one dielectric layer.

The metal layer 22 can be located on the dielectric layer 20. In some embodiments, the metal layer 22 may include, without limitation, for example, a refractory metal or a compound thereof. For example, the metal layer 22 may include, without limitation, for example niobium (Nb), molybdenum (Mo), tantalum (Ta), tungsten (W), rhenium (Re), titanium (Ti), vanadium (V), chromium (Cr), zirconium (Zr), hafnium (Hf), ruthenium (Ru), osmium (Os), iridium (Ir) and other metals, or compounds of these metals, such as tantalum nitride (TaN), titanium nitride (TiN), and tungsten carbide (WC), etc.

The passivation layer 24 may be disposed on the dielectric layer 20. The passivation layer 24 may be disposed on the metal layer 22. The passivation layer 24 may cover at least a portion of the dielectric layer 20. The passivation layer 24 may cover at least a portion of the metal layer 22.

Referring to FIG. 1A, the recess 100t extends from the dielectric layer 20 to the substrate 10. The passivation layer 24 can be disposed to cover the sidewall 100w of the recess 100t. The passivation layer 24 can be disposed to cover a surface 10s of the substrate 10.

The semiconductor structure 100 may include one or more contacts. In some embodiments, the semiconductor structure 100 may include a metal contact 18c1 disposed within the dielectric layers 16 and 18. In some embodiments, the semiconductor structure 100 may include a metal contact 18c2 disposed within the dielectric layers 16 and 18. In some embodiments, the semiconductor structure 100 may include a metal contact 20c1 disposed within the dielectric layer 20. In some embodiments, the semiconductor structure 100 may include a metal contact 20c2 disposed within the dielectric layer 20.

The semiconductor structure 100 may include one or more interlayered connection elements. In some embodiments, the semiconductor structure 100 may include an interlayered connection element 18v1 electrically connected between the metal contact 18c1 and the metal contact 20c1. In some embodiments, the semiconductor structure 100 may include an interlayered connection element 18v2 electrically connected between the metal contact 18c2 and the metal contact 20c2. In some embodiments, the semiconductor structure 100 may include an interlayered connection element 20v1 electrically connected between the metal contact 20c1 and the metal layer 22. In some embodiments, the semiconductor structure 100 may include an interlayered connection element 20v2 electrically connected between the metal contact 20c2 and the metal layer 22.

Each of the interlayered connection elements 18v1, 18v2, 20v1 and 20v2 can be referred to as a via.

Referring to FIG. 1A, the semiconductor structure 100 includes regions 100A, 100B and 100C. The region 100A can be referred to as a scribe line or a scribe region. The semiconductor structure 100 can be separated or singulated into some semiconductor devices (not denoted in FIG. 1A, which can include structures in region 100B and 100C) by cutting/sawing technique along the region 100A.

The techniques that may be used to cut/saw the semiconductor structure 100 includes, but are not limited to, mechanical cutting or sawing, laser ablation or laser grooving, plasma dicing, wet etching or dry etching of grooves or trenches, and or laser induced cleaving/splitting.

The region 100B can include a protection structure (e.g. a seal ring). For example, the seal ring can be disposed around integrated circuits (which can be disposed in region 100C) for protection. For example, when applying cutting technique to the semiconductor structure 100 along the region 100A, the seal ring in region 100B can stop the propagation of the crack (which may be rendered from the scribe region 100A) so as to protect the structure within region 100C.

The structure, which includes the metal contact 18c1, the interlayered connection element 18v1, the metal contact 20c1, the interlayered connection element 20v1 and the metal layer 22, can have metal, alloy or other suitable material to protect the circuit (for example, internal circuitry within region 100C) from damage.

The structure, which includes the metal contact 18c2, the interlayered connection element 18v2, the metal contact 20c2, the interlayered connection element 20v2 and the metal layer 22, can have metal, alloy or other suitable material to protect the circuit (for example, internal circuitry within region 100C) from damage.

The region 100C can be an area occupied by circuit(s) or integrated circuit(s). The region 100C can be referred to as an active device area.

A relatively thin portion (not denoted in FIG. 1A) under the recess 100t in the region 100A of the semiconductor structure 100 can save cost. For example, time of cutting/sawing operation on the semiconductor structure 100 can be reduced. For example, power consumed by cutting/sawing operation can be minimized. For example, lifetime of cutting tool(s) (e.g. knife or blade of knife) can be extended.

A relatively thin portion (not denoted in FIG. 1A) under the recess 100t in the region 100A of the semiconductor structure 100 can also prevent cracks or delamination. Singulation process conducted within the recess 100t does not pass through interlayered interface (for example, an interface between the substrate 10 and the group III-V layer 12) and thus cracks or delamination resulting from lattice mismatch can be avoided.

Lattice mismatch between the substrate 10 and the group III-V layer 12 may cause the interface between the substrate 10 and the group III-V layer 12 to be vulnerable when applying cutting technique to the semiconductor structure 100. The passivation layer 24, which defines the recess 100t in the region 100A, can cover the interface between the substrate 10 and the group III-V layer 12 for protection. Therefore, the yield rate of manufacturing can be improved. For example, propagation of the crack or delamination caused by cutting operation on the interface between the substrate 10 and the passivation layer 24 can be stopped by the passivation layer 24 covering on the sidewall of the substrate 10 and the group III-V layer 12.

Figure 1B:
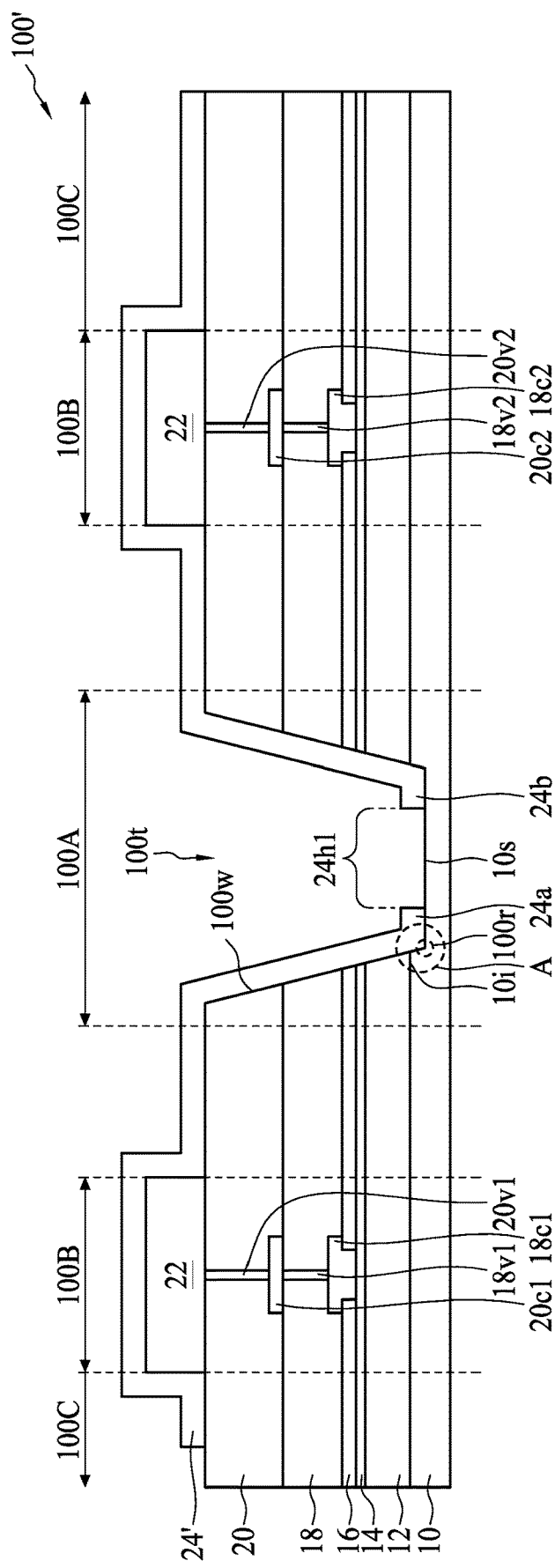
FIG. 1B is a simplified schematic cross-sectional view of a portion of a semiconductor wafer according to certain embodiments of the present disclosure.

FIG. 1B is a simplified schematic cross-sectional view of a portion of a semiconductor wafer according to certain embodiments of the present disclosure.

FIG. 1B shows a semiconductor structure 100' according to certain embodiments of the present disclosure. As shown in FIG. 1B, the semiconductor structure 100' includes a substrate 10, group III-V layers 12 and 14, dielectric layers 16, 18 and 20, a metal layer 22 and a passivation layer 24'. The semiconductor structure 100' further includes a recess 100t. In some embodiments, the recess 100t can also be referred to as a trench.

The semiconductor structure 100' shown in FIG. 1B is similar to the semiconductor structure 100 shown in FIG. 1A, except for that the passivation layer 24' of the semiconductor structure 100' includes an opening 24h1 near the bottom of the recess 100t. The opening 24h1 exposes a portion of the bottom of the recess 100t. The opening 24h1 exposes a portion of the substrate 10. The opening 24h1 exposes a portion of a surface 10s of the substrate 10.

Referring to FIG. 1B, the passivation layer 24' includes a portion 24a disposed on the surface 10s of the substrate 10. The passivation layer 24' includes a portion 24b disposed on the surface 10s of the substrate 10. The opening 24h1 can be defined by the portion 24a and the portion 24b.

The semiconductor structure 100' can be cut/saw along the opening 24h1. Cutting/sawing the semiconductor structure 100' along the opening 24h1 may bring many benefits. For example, the portion of the substrate 10 exposed by the opening 24h1 has a smaller thickness compared to the other portions of the semiconductor structure 100', cutting/sawing the semiconductor structure 100' along the opening 24h1 can reduce the cost of the overall manufacturing process.

In addition, cutting/sawing the semiconductor structure 100' along the opening 24h1 merely involves cutting/sawing the substrate 10, which is a single-layered structure. Therefore, cracks or delamination will not be introduced in the manufacturing process.

In some embodiments, the opening 24h1 can be utilized as an alignment mark during the pre-dicing procedure of the semiconductor structure 100'. In some embodiments, the opening 24h1 can increase the accuracy of the pre-dicing procedure. In some embodiments, the opening 24h1 can increase the speed of the pre-dicing procedure. In some embodiments, the opening 24h1 can improve the yield of the semiconductor structure 100'.

Referring now to the dotted circle A shown in FIG. 1B. In some embodiments, the portion 24a covers a corner 100r of the recess 100t. In some embodiments, the portion 24a covers an interface 10i between the substrate 10 and the group III-V layer 12. The portion 24a can prevent moisture from entering the interface 10i between the substrate 10 and the group III-V layer 12. The portion 24a can prevent pollutants from entering the interface 10i between the substrate 10 and the group III-V layer 12. In addition, propagation of the crack or delamination caused by cutting operation on the interface between the substrate 10 and the passivation layer 24 can be stopped by the portion 24a.

Figure 1C:
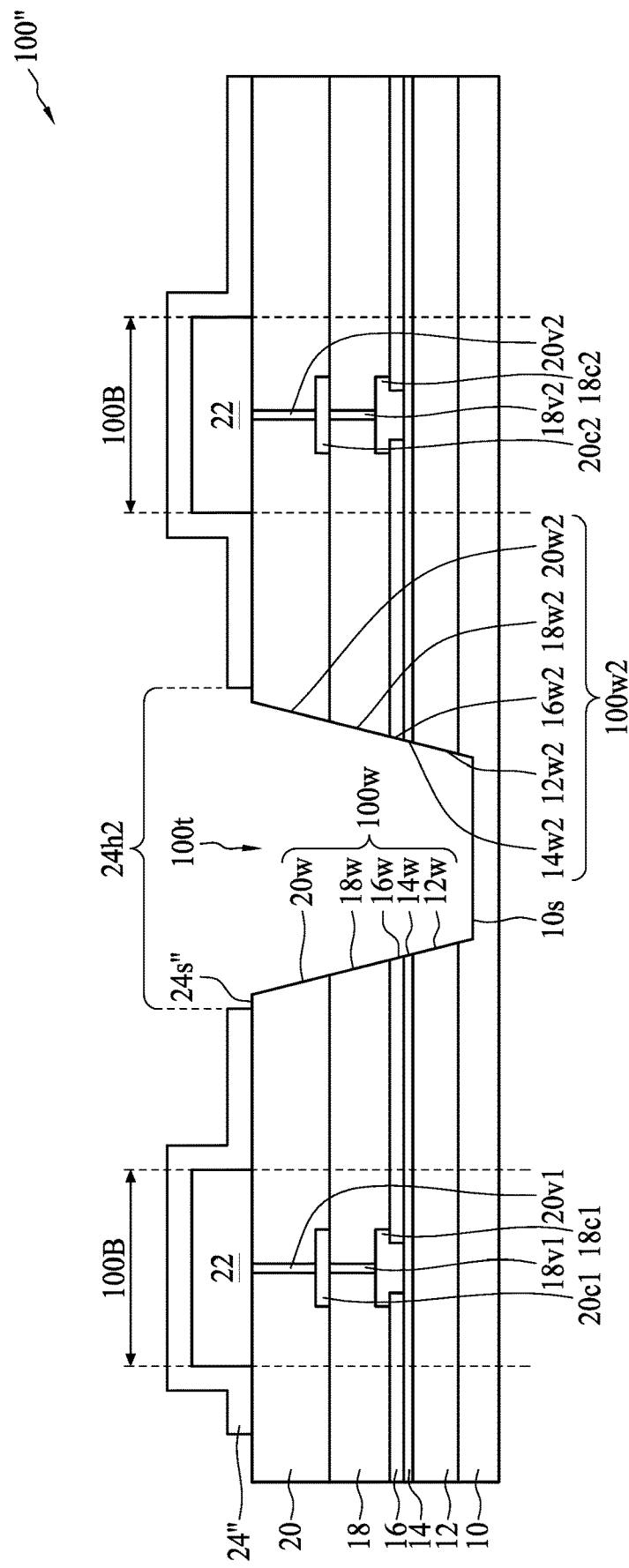
FIG. 1C is a simplified schematic cross-sectional view of a portion of a semiconductor wafer according to certain embodiments of the present disclosure.

FIG. 1C is a simplified schematic cross-sectional view of a portion of a semiconductor wafer according to certain embodiments of the present disclosure.

FIG. 1C shows a semiconductor structure 100" according to certain embodiments of the present disclosure. As shown in FIG. 1C, the semiconductor structure 100" includes a substrate 10, group III-V layers 12 and 14, dielectric layers 16, 18 and 20, a metal layer 22 and a passivation layer 24". The semiconductor structure 100" further includes a recess 100t. In some embodiments, the recess 100t can also be referred to as a trench.

The semiconductor structure 100" shown in FIG. 1C is similar to the semiconductor structure 100 shown in FIG. 1A, except for that the passivation layer 24" of the semiconductor structure 100" includes an opening 24h2. The opening 24h2 exposes a portion of the bottom of the recess 100t. The opening 24h2 exposes a portion of the substrate 10. The opening 24h2 exposes a portion of a surface 10s of the substrate 10.

The recess 100t may include an inclined sidewall 100w. The sidewall 100w may include sidewalls 12w, 14w, 16w, 18w and 20w. The sidewall 100w is adjacent to the region 100B including protection structures. The sidewall 12w connects the group III-V layer 14 and the substrate 10. The sidewall 14w connects the group III-V layer 12 and the dielectric layer 16. The sidewall 16w connects the group III-V layer 14 and the dielectric layer 18. The sidewall 18w connects the dielectric layer 16 and the dielectric layer 20. The sidewall 100w extends from the dielectric layer 20 to the substrate 10. The sidewall 100w connects an upper surface 24s" of the passivation layer 24" to a surface 10s of the substrate 10.

The recess 100t may include an inclined sidewall 100w2. The sidewall 100w2 may include sidewalls 12w2, 14w2, 16w2, 18w2 and 20w2. The sidewall 100w2 is adjacent to the region 100B including protection structures.

The opening 24h2 exposes a sidewall 100w of the recess 100t. As shown in FIG. 1C, the sidewall 12w of the group III-V layer 12 is exposed. The sidewall 14w of the group III-V layer 14 is exposed. The sidewall 16w of the dielectric layer 16 is exposed. The sidewall 18w of the dielectric layer 18 is exposed. The sidewall 20w of the dielectric layer 20 is exposed.

The semiconductor structure 100" can be cut/saw along the recess 100t. As previously discussed, cutting/sawing the semiconductor structure 100" along the recess 100t may bring many benefits. In some embodiments, the recess 100t can be utilized as an alignment mark during the pre-dicing procedure of the semiconductor structure 100". In some embodiments, the recess 100t can increase the accuracy of the pre-dicing procedure. In some embodiments, the recess 100t can increase the speed of the pre-dicing procedure. In some embodiments, the recess 100t can improve the yield of the semiconductor structure 100".

FIG. 2A, FIG. 2B, FIG. 2C, FIG. 2D, FIG. 2E, FIG. 2F, FIG. 2G and FIG. 2H illustrate a method of manufacturing a semiconductor structure according to some embodiments of the present disclosure.

The operations shown in FIG. 2A, FIG. 2B, FIG. 2C, FIG. 2D, FIG. 2E, FIG. 2F, FIG. 2G and FIG. 2H may be utilized to produce a semiconductor structure similar to the semiconductor structure 100 shown in FIG. 1A.

Figure 2A:
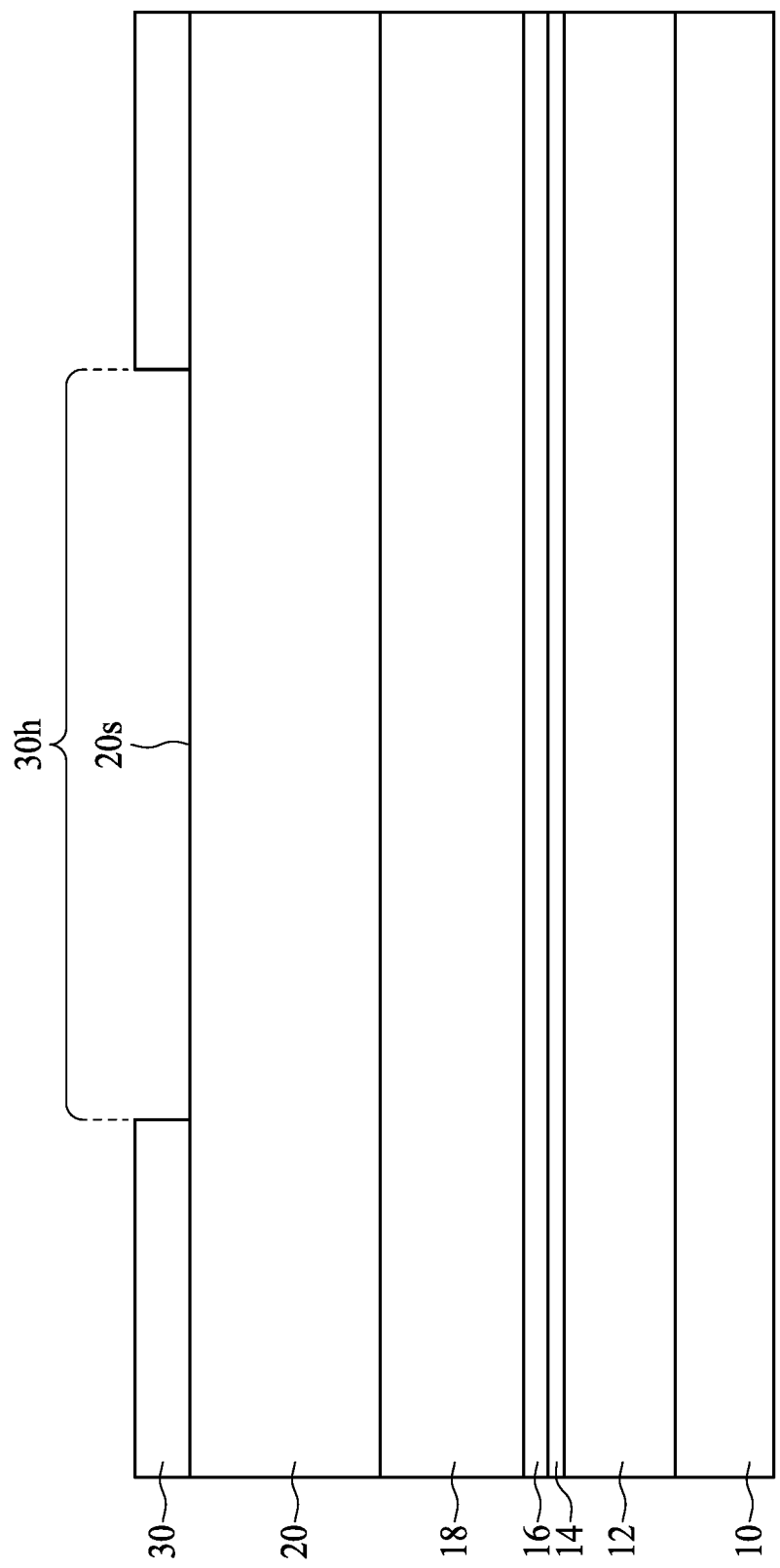
FIG. 2A, FIG. 2B, FIG. 2C, FIG. 2D, FIG. 2E, FIG. 2F, FIG. 2G and FIG. 2H illustrate a method of manufacturing a semiconductor structure according to some embodiments of the present disclosure.

Referring to FIG. 2A, a substrate 10 is provided, and group III-V layers 12 and 14 are disposed on an upper surface of the substrate 10. Dielectric layers 16, 18 and 20 are then disposed on an upper surface of the group III-V layer 14. A patterned photoresist layer 30 is provided (e.g. formed) on the dielectric layer 20. The patterned photoresist layer 30 defines an opening 30h. The opening 30h exposes a portion of the dielectric layer 20. The opening 30h exposes a surface 20s of the dielectric layer 20.

Figure 2B:
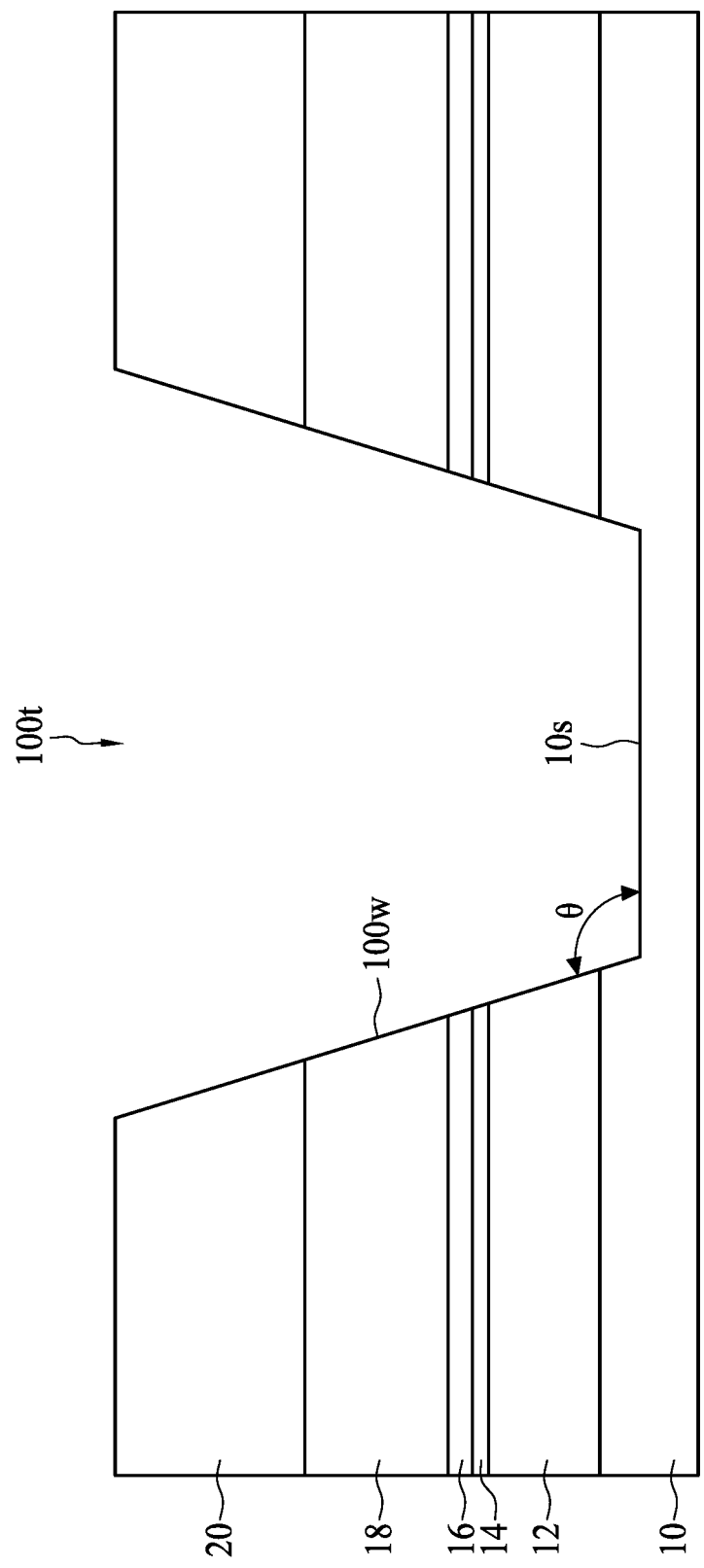

Referring to FIG. 2B, portions of the substrate 10, the group III-V layers 12 and 14 and dielectric layers 16, 18 and 20 are removed and a recess 100t is formed. Subsequently, the patterned photoresist layer 30 is then removed.

In some embodiments, the recess 100t can be formed by an etching process. In some embodiments, the recess 100t may be formed by dry etching, wet etching, or a combination of dry and wet etching. In some embodiments, the recess 100t may be formed by laser ablation or laser grooving. In some embodiments, the recess 100t may be formed by any other suitable techniques.

An angle θ exists between the sidewall 100w and the surface 10s of the substrate 10. The angle θ varies depending on the techniques used to form the recess 100t.

In some embodiments, the angle θ is in a range of 90 degrees to 100 degrees. In some embodiments, the angle θ is in a range of 100 degrees to 110 degrees. In some embodiments, the angle θ is in a range of 110 degrees to 120 degrees. In some embodiments, the angle θ is in a range of 120 degrees to 130 degrees. In some embodiments, the angle θ is in a range of 130 degrees to 140 degrees. In some embodiments, the angle θ is in a range of 140 degrees to 150 degrees. In some embodiments, the angle θ is in a range of 90 degrees to 150 degrees.

Figure 2C:
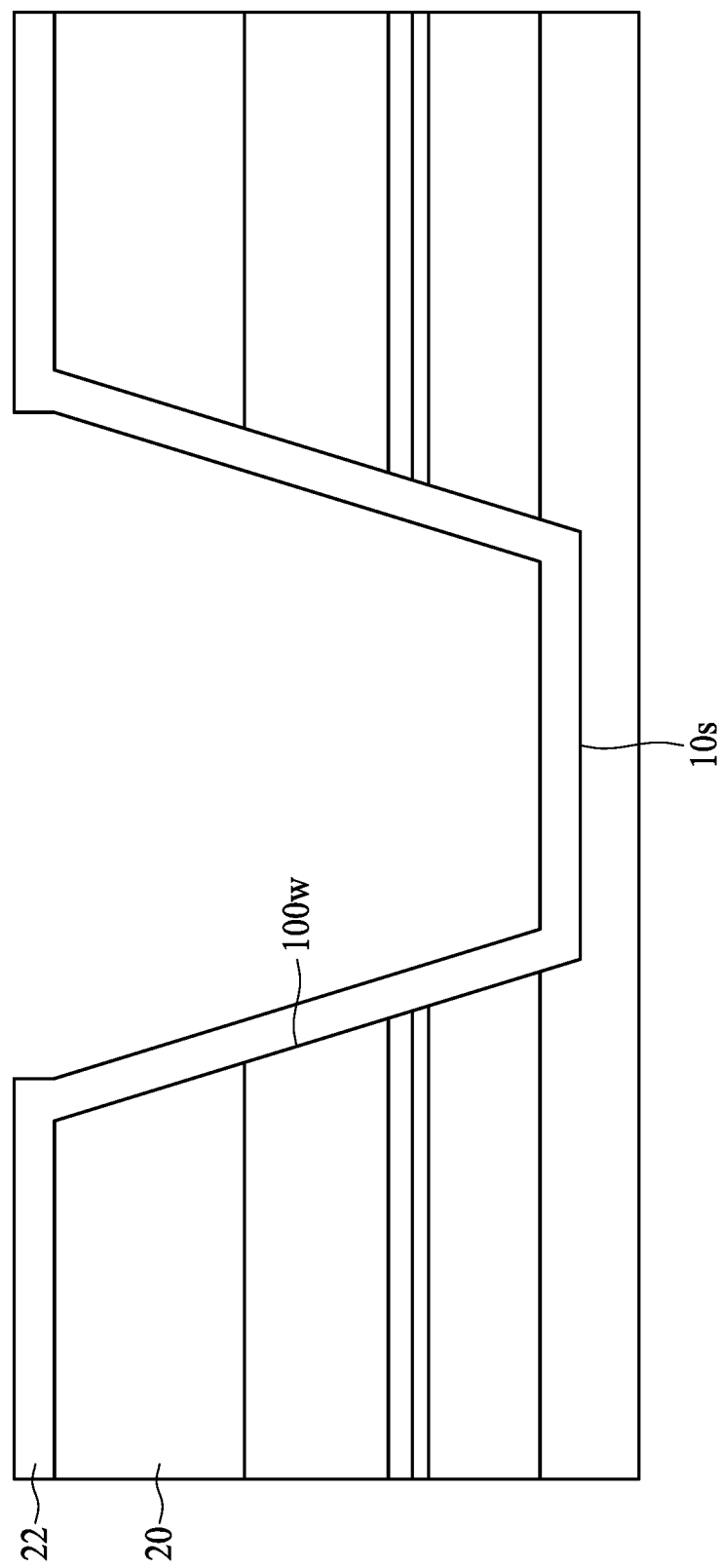

Referring to FIG. 2C, a metal layer 22 is formed on the dielectric layer 20 and the recess 100t. The metal layer 22 covers an upper surface of the dielectric layer 20. The metal layer 22 covers the sidewall 100w of the recess 100t. The metal layer 22 covers the surface 10s of the substrate 10.

In some embodiments, the metal layer 22 can be formed by physical vapor deposition (PVD), chemical vapor deposition (CVD), atomic layer deposition (ALD), plating, and/or other suitable deposition steps.

Figure 2D:
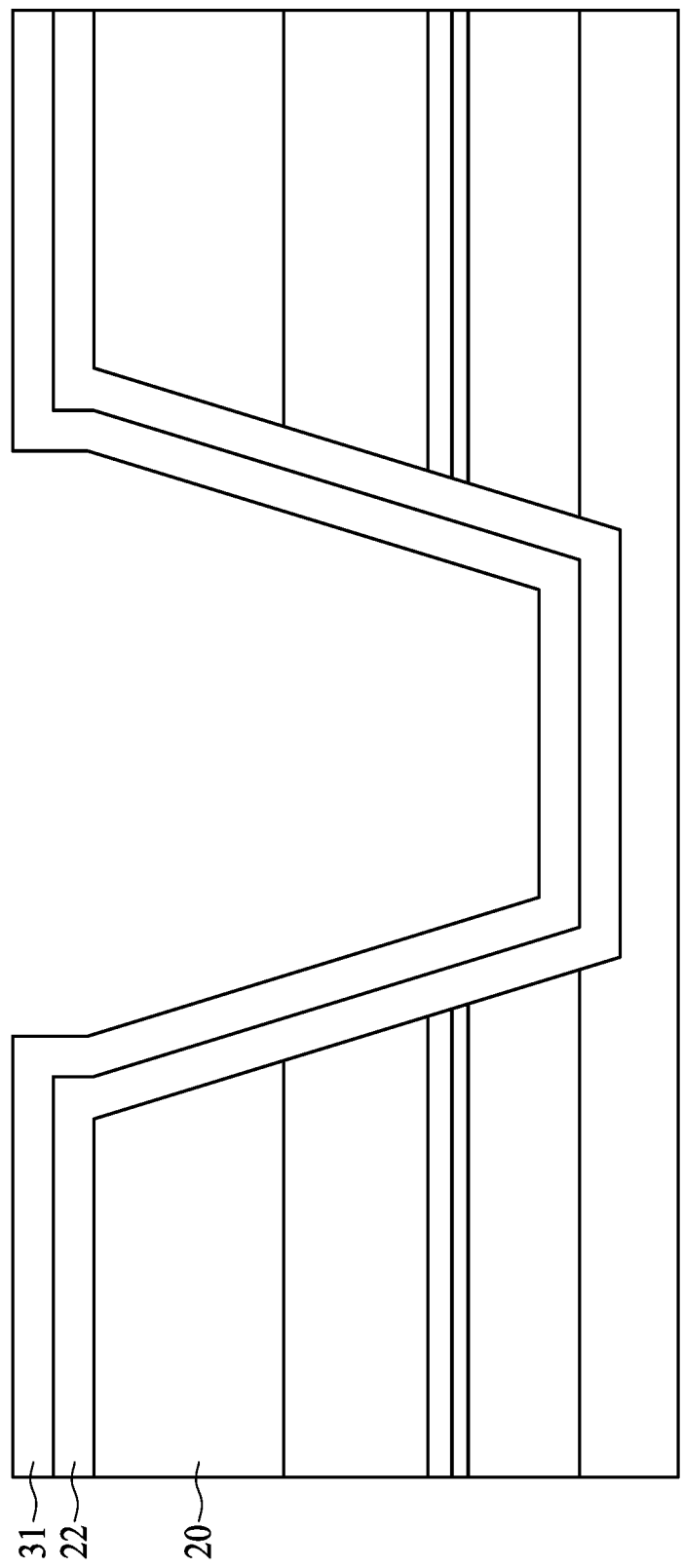

Referring to FIG. 2D, a photoresist layer 31 is provided (e.g. formed) on the metal layer 22. The photoresist layer 31 can be conformally formed on the metal layer 22.

Figure 2E:
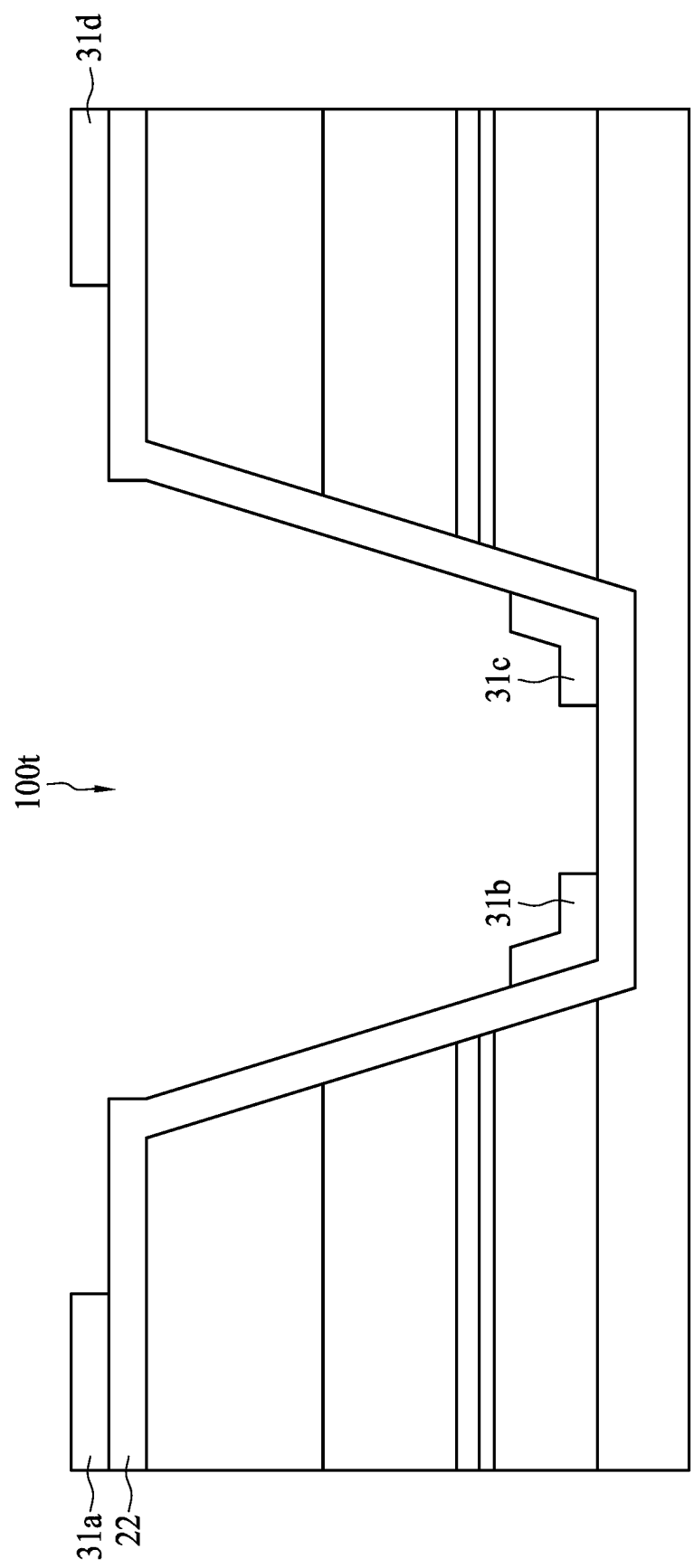

Referring to FIG. 2E, a photolithography process is performed to remove specific portions of the photoresist layer 31 in order to form a patterned photoresist layer. After the photolithography process, portions 31a, 31b, 31c and 31d of the photoresist layer 31 remain.

Among the portions 31a, 31b, 31c and 31d, the portions 31a and 31b are desired while the portions 31b and 31c should be removed.

If the portions 31b and 31c are not removed, portions of the metal layer 22 that are under the portions 31b and 31c cannot be removed in the subsequent procedures and thus will remain in the recess 100t. The remaining metal layer will be located around the bottom corners of the recess 100t. The remaining metal layer within the recess 100t may adversely affect the cutting/sawing procedure of the semiconductor structure. For example, remaining metal layer within the recess 100t may cause damage to the wafer sawing/dicing machine that is used to cut/saw the wafer through the recess 100t.

The portions 31b and 31c can result from the focus setting of the photolithography equipment used. That is, since the recess 100t has a depth, if the focus is set according to the top of the recess 100t, then the photoresist layer 31 at the bottom of the recess 100t will be out of the range of the focus. On the other hand, if the focus is set according to the bottom of the recess 100t, the photoresist layer 31 around the top of the recess 100t will be out of the range of the focus.

In order to produce a patterned photoresist layer that extends from the top to the bottom of a recess, a two-step photolithography process (that is, the operations shown in FIGS. 2E and 2F) is proposed.

Figure 2F:
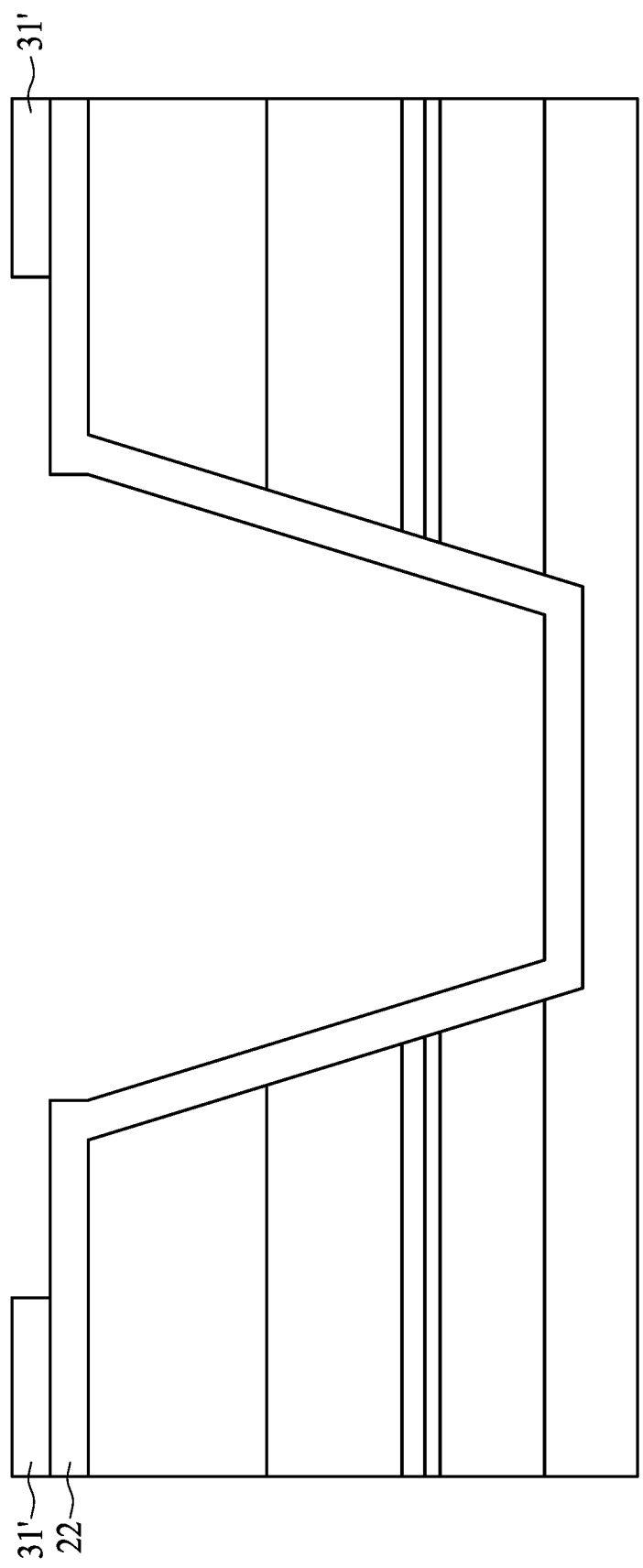

Referring to FIG. 2F, a photolithography process is performed to remove the portions 31b and 31c. The remaining portions 31a and 31d can be referred to as a patterned photoresist layer 31'. In some embodiments, the focus used in the operation shown in FIG. 2E is different from that used in the operation shown in FIG. 2F. In some embodiments, the focus used in the operation shown in FIG. 2E is shorter than that used in the operation shown in FIG. 2F.

In some embodiments, the focus used in the operation shown in FIG. 2E is selected in accordance with the distance between the top of the recess 100t and the photolithography equipment. In some embodiments, the focus used in the operation shown in FIG. 2F is selected in accordance with the distance between the bottom of the recess 100t and the photolithography equipment.

Figure 2G:
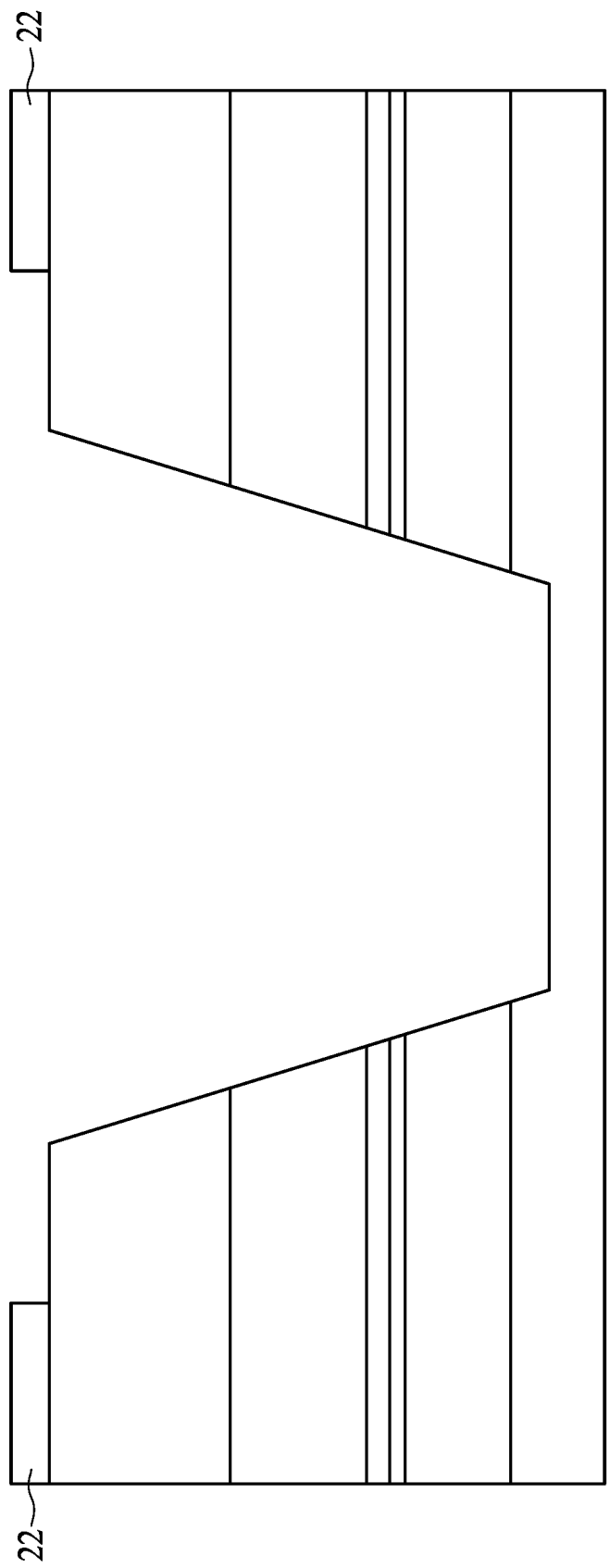

Referring to FIG. 2G, a portion of the metal layer 22 is removed. Subsequently, the patterned photoresist layer 31' is removed. The remained portions of the metal layer 22 can also be referred to as a patterned metal layer.

Figure 2H:
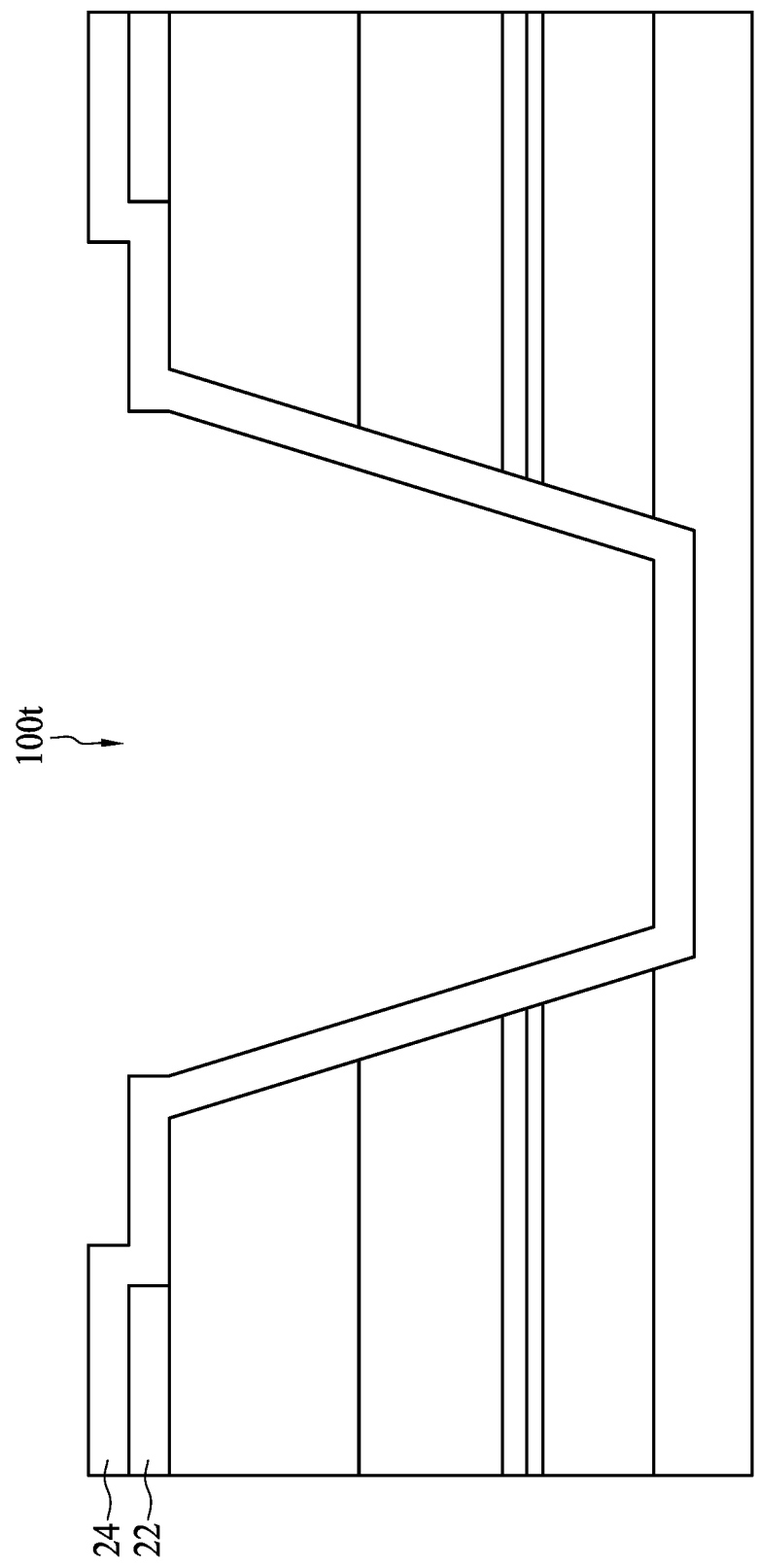

Referring to FIG. 2H, a passivation layer 24 is formed on the metal layer 22 and the recess 100t. The passivation layer 24 can be formed conformally along the sidewalls of the recess 100t.

FIG. 2A, FIG. 2B, FIG. 2C, FIG. 2D, FIG. 2E, FIG. 2F, FIG. 2G, FIG. 2H, FIG. 2I-1 and FIG. 2J-1 illustrate a method of manufacturing a semiconductor structure according to some embodiments of the present disclosure.

The operations shown in FIG. 2A, FIG. 2B, FIG. 2C, FIG. 2D, FIG. 2E, FIG. 2F, FIG. 2G, FIG. 2H, FIG. 2I-1 and FIG. 2J-1 may be utilized to produce a semiconductor structure similar to the semiconductor structure 100 shown in FIG. 1B.

Figures 1, 2I:
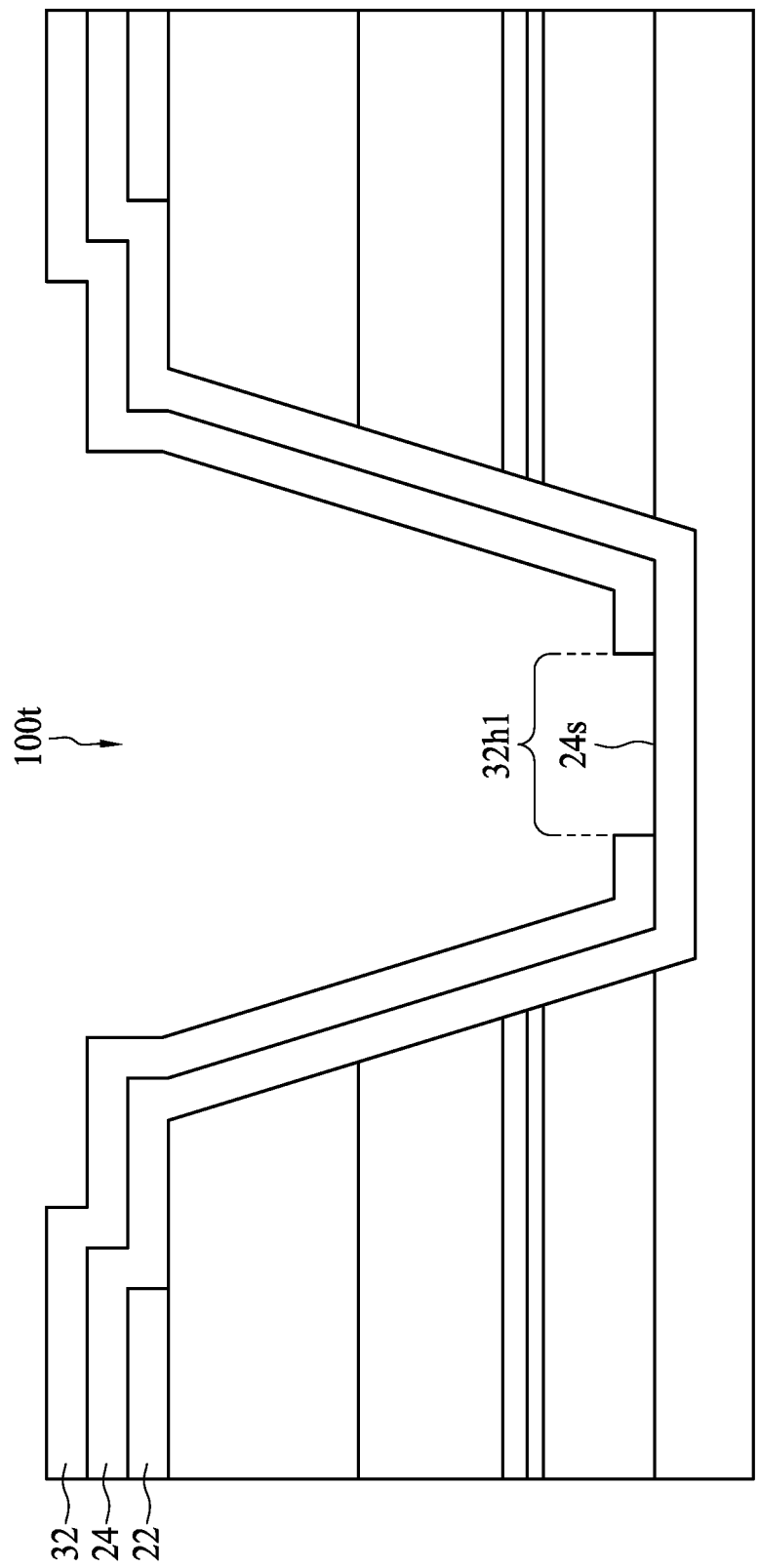

The operation shown in FIG. 2I-1 can be performed after the operation shown in FIG. 2H. Referring to FIG. 2I-1, a patterned photoresist layer 32 is formed on the passivation layer 24. The patterned photoresist layer 32 includes an opening 32h1 near the bottom of the recess 100t. The opening 32h1 exposes a portion of the passivation layer 24. The opening 32h1 exposes a surface 24s of the passivation layer 24.

Figures 2, 2I:
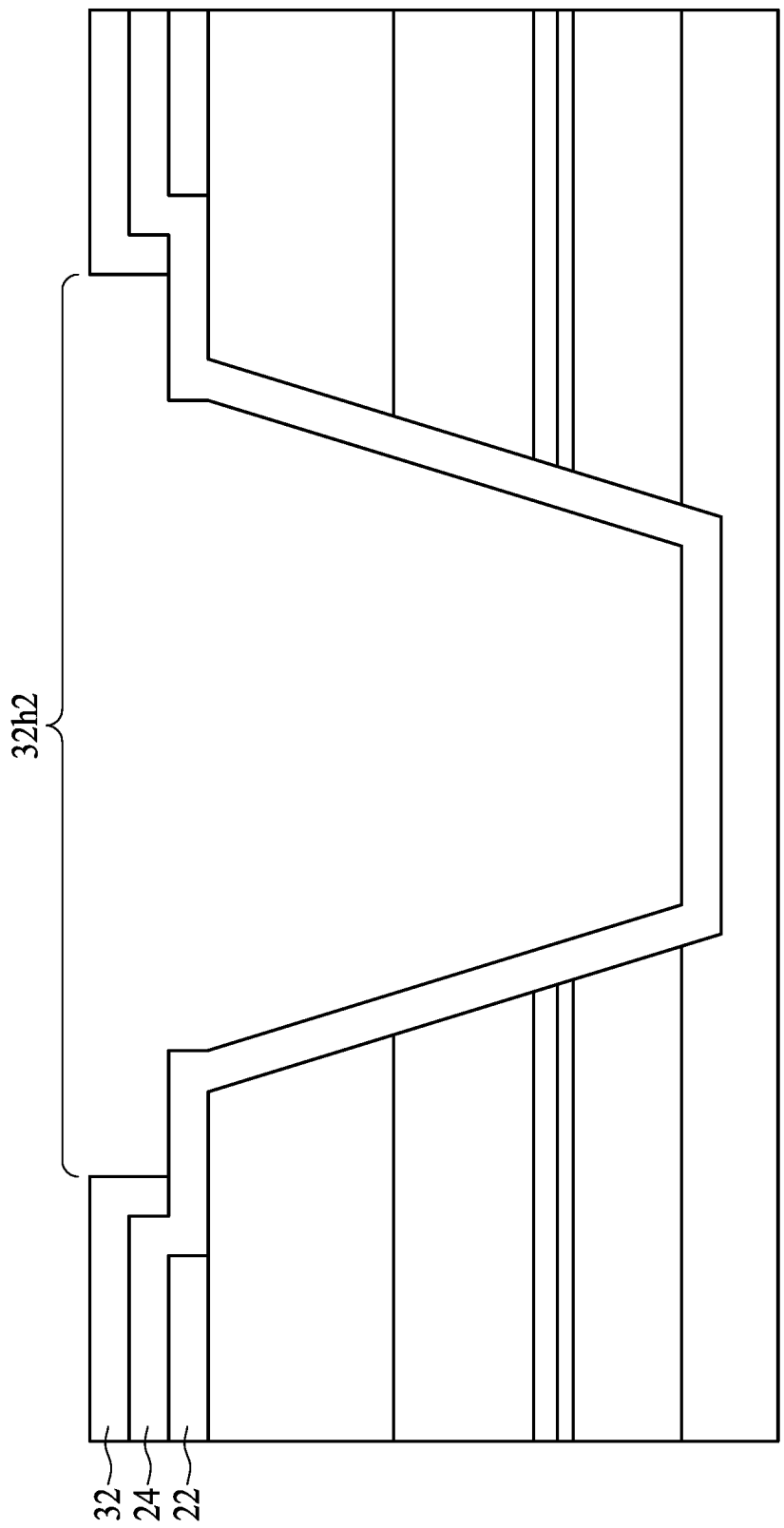
Figures 1, 2J:
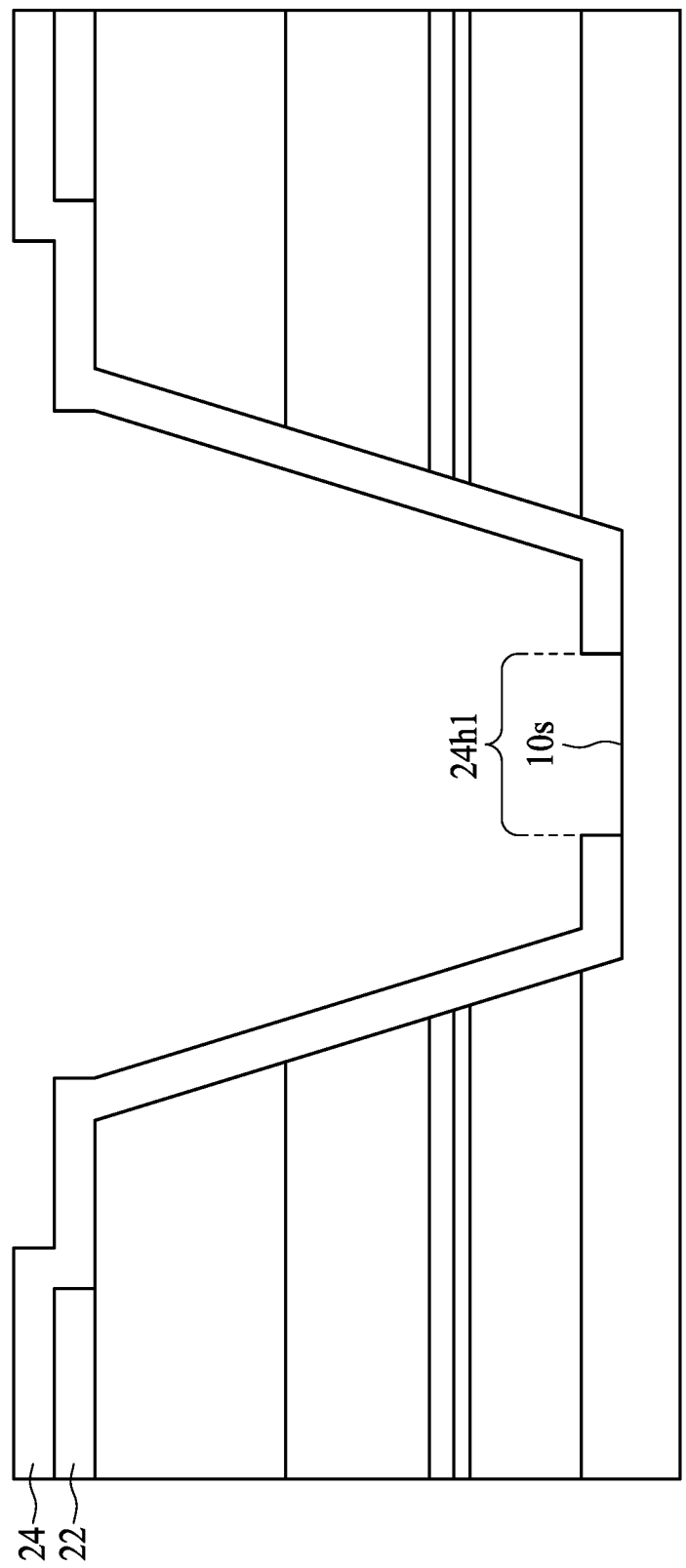
Figures 2, 2J:
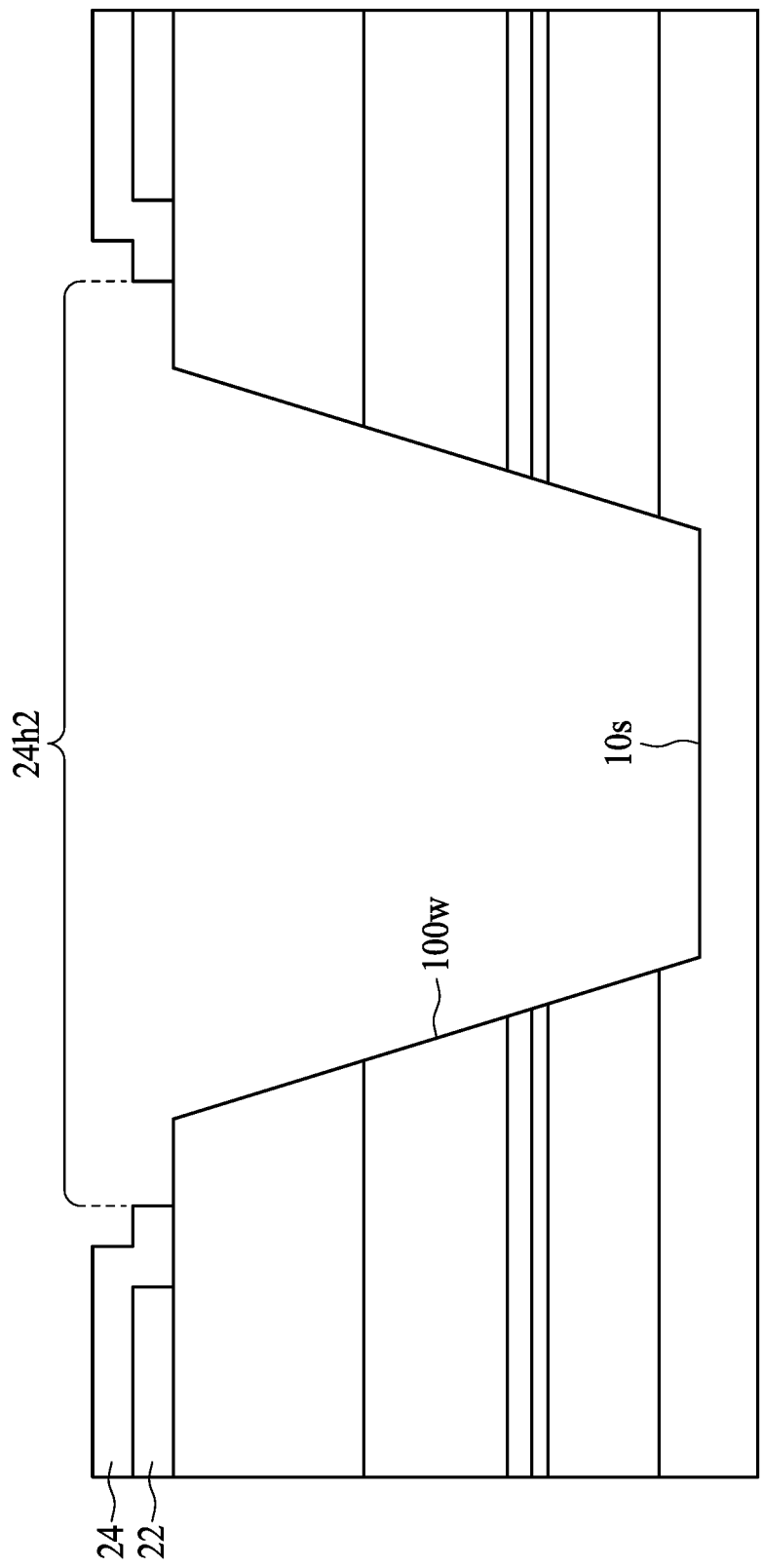

The operation shown in FIG. 2J-1 can be performed after the operation shown in FIG. 2I-1. Referring to FIG. 2J-1, a portion of the passivation layer 24 is removed, and then the patterned photoresist layer 32 is removed. The operation shown in FIG. 2J-1 produces an opening 24h1 from the passivation layer 24. The opening 24h1 exposes a portion of the substrate 10. The opening 24h1 exposes a surface 10s of the substrate 10.

FIG. 2A, FIG. 2B, FIG. 2C, FIG. 2D, FIG. 2E, FIG. 2F, FIG. 2G, FIG. 2H, FIG. 2I-2 and FIG. 2J-2 illustrate a method of manufacturing a semiconductor structure according to some embodiments of the present disclosure.

The operations shown in FIG. 2A, FIG. 2B, FIG. 2C, FIG. 2D, FIG. 2E, FIG. 2F, FIG. 2G, FIG. 2H, FIG. 2I-2 and FIG. 2J-2 may be utilized to produce a semiconductor structure similar to the semiconductor structure 100 shown in FIG. 1C.

The operation shown in FIG. 2I-2 can be performed after the operation shown in FIG. 2H. Referring to FIG. 2I-2, a patterned photoresist layer 32 is formed on the passivation layer 24. The patterned photoresist layer 32 includes an opening 32h2. The opening 32h2 exposes a portion of the passivation layer 24.

The operation shown in FIG. 2J-2 can be performed after the operation shown in FIG. 2I-2. Referring to FIG. 2J-2, a portion of the passivation layer 24 is removed, and then the patterned photoresist layer 32 is removed. The operation shown in FIG. 2J-2 produces an opening 24h2 from the passivation layer 24. The opening 24h2 exposes the recess 100t. The opening 24h2 exposes the sidewall 100w of the recess 100t. The opening 24h2 exposes a portion of the substrate 10. The opening 24h1 exposes a surface 10s of the substrate 10.

Figure 3A:
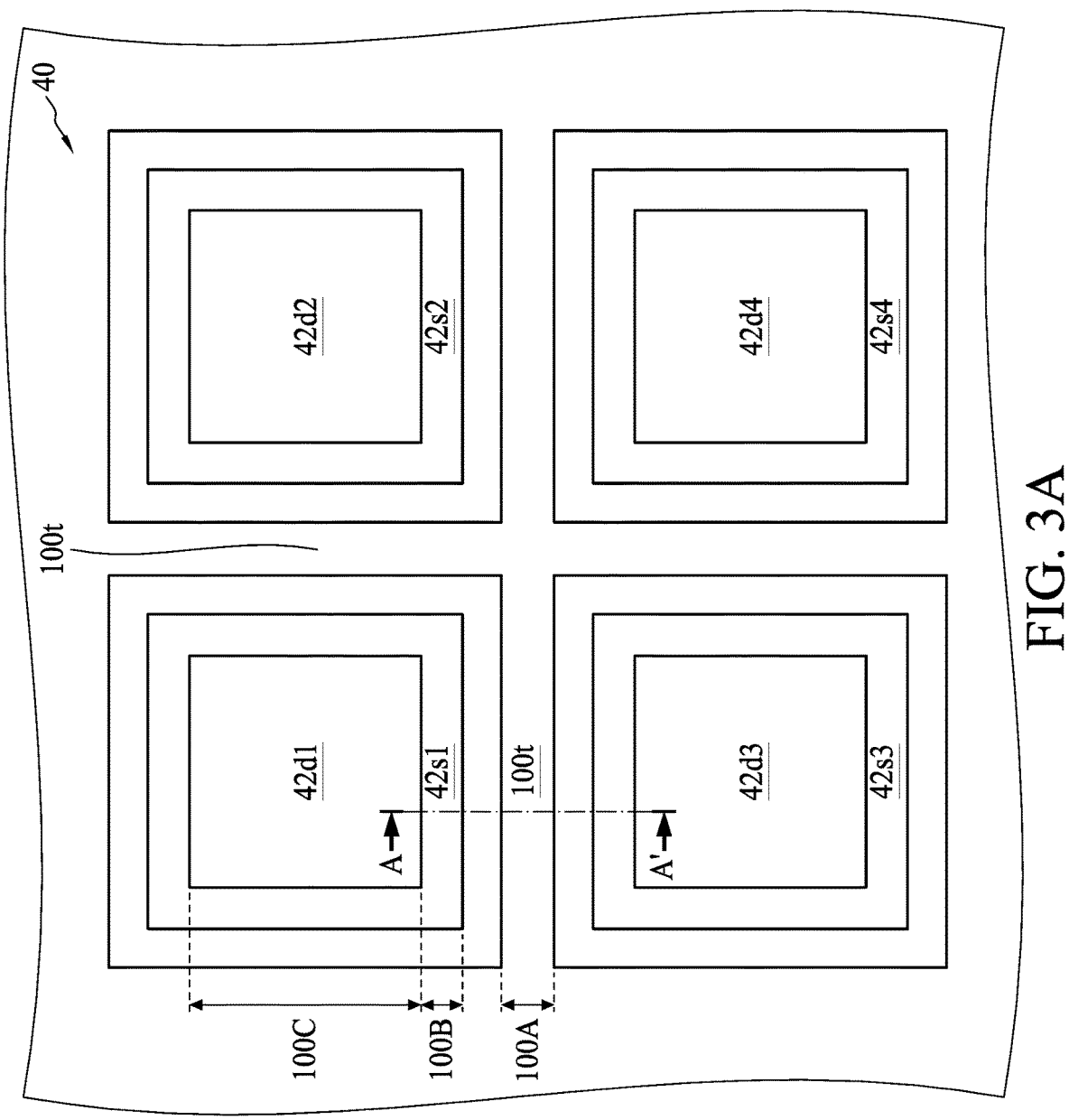
FIG. 3A shows a simplified schematic diagram of a plan view of a portion of a wafer comprising a plurality of semiconductor devices and a pre-dicing trench according to certain embodiments of the present disclosure.

FIG. 3A shows a simplified schematic diagram of a plan view of a portion of a wafer comprising a plurality of semiconductor devices and a pre-dicing trench according to certain embodiments of the present disclosure.

Referring to FIG. 3A, the wafer 40 includes semiconductor devices 42d1, 42d2, 42d3 and 42d4. The semiconductor device 42d1 includes a seal ring 42s1 surrounding the peripherals of the semiconductor device 42d1. The semiconductor device 42d2 includes a seal ring 42s2 surrounding the peripherals of the semiconductor device 42d2. The semiconductor device 42d3 includes a seal ring 42s3 surrounding the peripherals of the semiconductor device 42d3. The semiconductor device 42d4 includes a seal ring 42s4 surrounding the peripherals of the semiconductor device 42d4.

The recess 100t is disposed between the semiconductor device 42d1 and the semiconductor device 42d2. The recess 100t is disposed between the semiconductor device 42d1 and the semiconductor device 42d3. The recess 100t is disposed between the semiconductor device 42d2 and the semiconductor device 42d4. The recess 100t is disposed between the semiconductor device 42d3 and the semiconductor device 42d4. The semiconductor devices 42d1, 42d2, 42d3 and 42d4 can be singulated by sawing the wafer 40 along the recess 100t.

In some embodiments, the recess 100t has a width of around 40 micrometers (μm). In some embodiments, the region 100A has a width of around 40 μm.

Figure 3B:
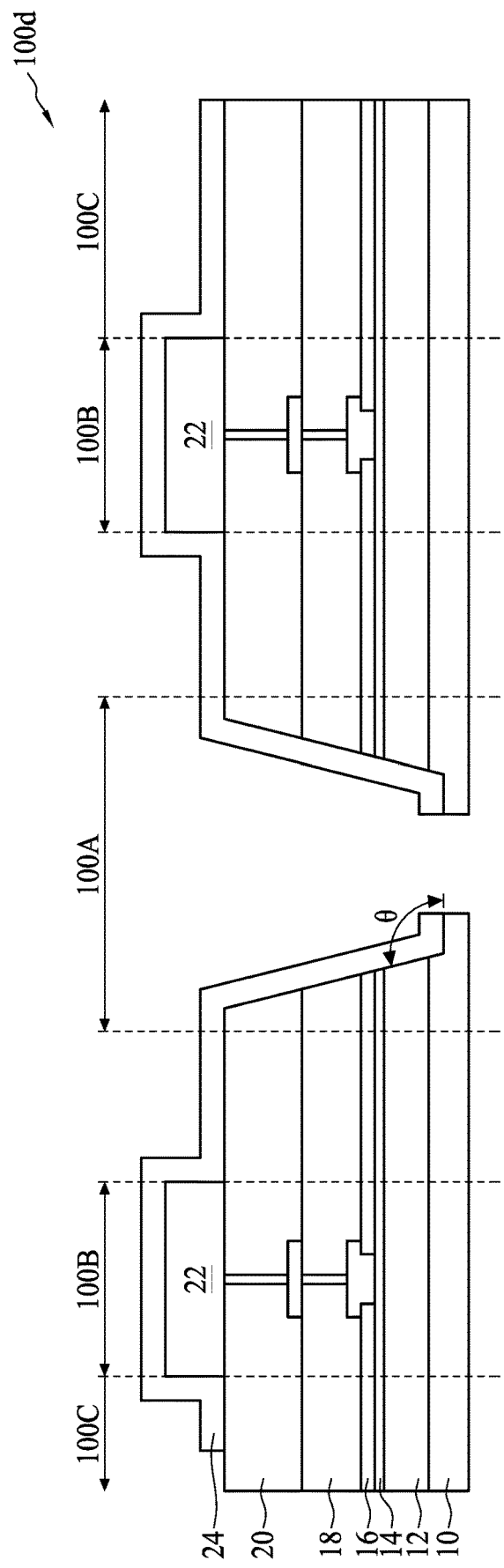
FIG. 3B is a simplified schematic cross-sectional view of a portion of a semiconductor wafer according to certain embodiments of the present disclosure.

FIG. 3B is a simplified schematic cross-sectional view of a portion of a semiconductor wafer according to certain embodiments of the present disclosure. The semiconductor structure 100d of FIG. 3B can be a cross-sectional view of a portion of the wafer 40 along the dotted line A-A' of FIG. 3A.

Figure 3C:
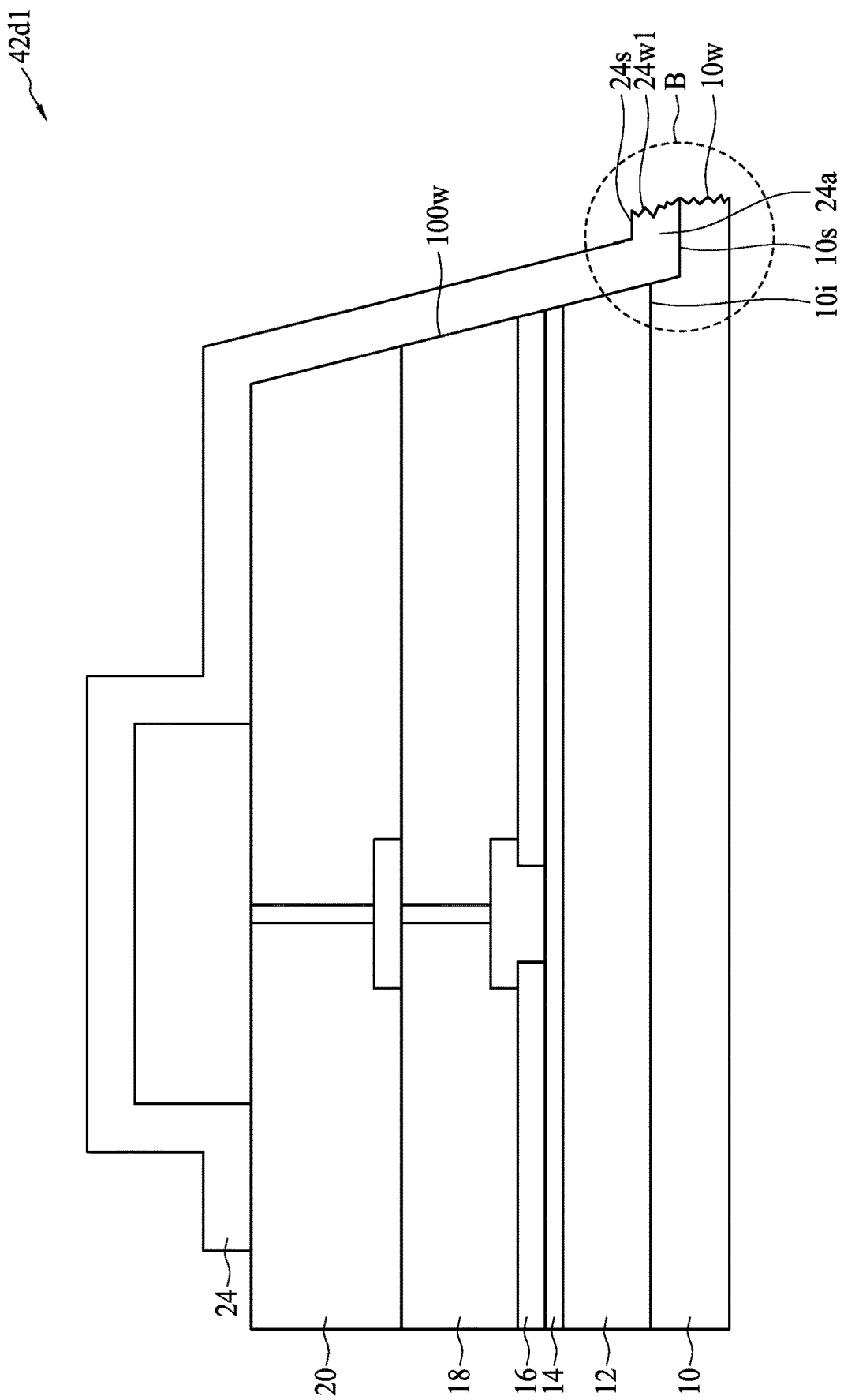
FIG. 3C shows a portion of a semiconductor device according to certain embodiments of the present disclosure.

FIG. 3C shows a portion of a semiconductor device according to certain embodiments of the present disclosure.

FIG. 3C shows a portion of the semiconductor device 42d1. The semiconductor device 42d1 can be singulated from the wafer 40. In some embodiments, the semiconductor device 42d1 can be singulated from the wafer 40 using a metal blade. In some embodiments, the semiconductor device 42d1 can be singulated from the wafer 40 using a water-cooled circular saw with diamond-tipped teeth.

Referring to the dotted circle B shown in FIG. 3C, the upper surface 24s of the passivation layer 24 may not be coplanar with the interface 10i. Also, the upper surface 10s of the substrate 10 may not be coplanar with the interface 10i. As previously discussed in accordance with FIG. 1B, the configuration of the portion 24a includes several advantages. For example, the portion 24a can prevent moisture from entering the interface 10i between the substrate 10 and the group III-V layer 12. The portion 24a can prevent pollutants from entering the interface 10i between the substrate 10 and the group III-V layer 12. In addition, propagation of the crack or delamination caused by cutting operation on the interface between the substrate 10 and the passivation layer 24 can be stopped by the portion 24a.

Referring again to the dotted circle B shown in FIG. 3C, the blade or the saw used to singulate the semiconductor device 42d1 may pass through the passivation layer 24 and introduce uneven edges to the passivation layer 24. The blade or the saw used to singulate the semiconductor device 42d1 may introduce uneven edges to the substrate 10.

As shown in the dotted circle B, the passivation layer 24 can have a relatively rough surface 24w1 adjacent to the substrate 10. The passivation layer 24 can have a relatively uneven surface 24w1 adjacent to the substrate 10. The passivation layer 24 can have a relatively rough surface 24w1 adjacent to the interface 10i. The passivation layer 24 can have a relatively uneven surface 24w1 adjacent to the interface 10i. The passivation layer 24 can have a relatively rough surface 24w1 facing opposite the interface 10i. The passivation layer 24 can have a relatively uneven surface 24w1 facing opposite the interface 10i. The passivation layer 24 can have a relatively rough surface 24w1 adjacent to the sidewall 100w. The passivation layer 24 can have an uneven surface 24w1 facing opposite the sidewall 100w. The passivation layer 24 can have a relatively rough surface 24w1 facing opposite the sidewall 100w.

The substrate 10 can have a relatively rough surface 10w adjacent to the interface 10i. The substrate 10 can have a relatively uneven surface 10w adjacent to the interface 10i. The substrate 10 can have a relatively rough surface 10w facing opposite/away the interface 10i. The substrate 10 can have a relatively uneven surface 10w facing opposite/away the interface 10i. The substrate 10 can have a relatively rough surface 10w adjacent to the sidewall 100w. The substrate 10 can have a relatively uneven surface 10w facing opposite/away the sidewall 100w.

Figure 3D:
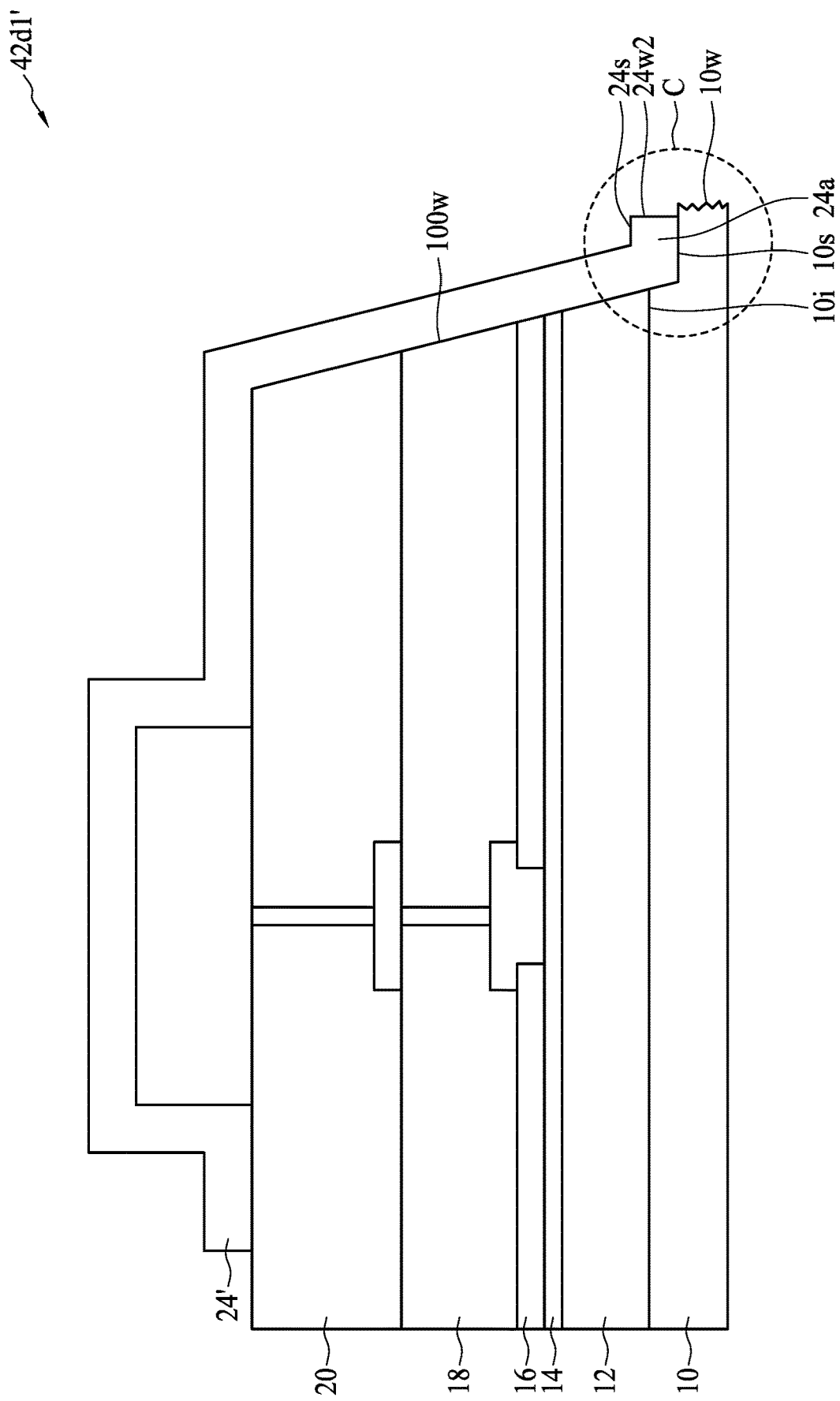
FIG. 3D shows a portion of a semiconductor device according to certain embodiments of the present disclosure.

FIG. 3D shows a portion of a semiconductor device according to certain embodiments of the present disclosure.

FIG. 3D shows a portion of the semiconductor device 42*d*1'. The semiconductor device 42*d*1' can be singulated from the wafer 40.

Referring to the dotted circle C shown in FIG. 3D, the blade or the saw used to singulate the semiconductor device 42*d*1' may introduce uneven edges to the substrate 10. The blade or the saw used to singulate the semiconductor device 42*d*1' may not pass through the passivation layer 24 and thus may not introduce uneven edges to the passivation layer 24.

As shown in the dotted circle C, the passivation layer 24 can have a relatively smooth surface 24*w*2 adjacent to the substrate 10. The passivation layer 24 can have a relatively smooth surface 24*w*2 adjacent to the interface 10*i*. The passivation layer 24 can have a relatively smooth surface 24*w*2 facing opposite the interface 10*i*. The passivation layer 24 can have a relatively smooth surface 24*w*2 facing opposite the sidewall 100*w*.

The substrate 10 can have a relatively rough surface 10*w* adjacent to the interface 10*i*. The substrate 10 can have a relatively uneven surface 10*w* adjacent to the interface 10*i*. The substrate 10 can have a relatively rough surface 10*w* facing opposite the interface 10*i*. The substrate 10 can have a relatively uneven surface 10*w* facing opposite the interface 10*i*.

Figure 3E:
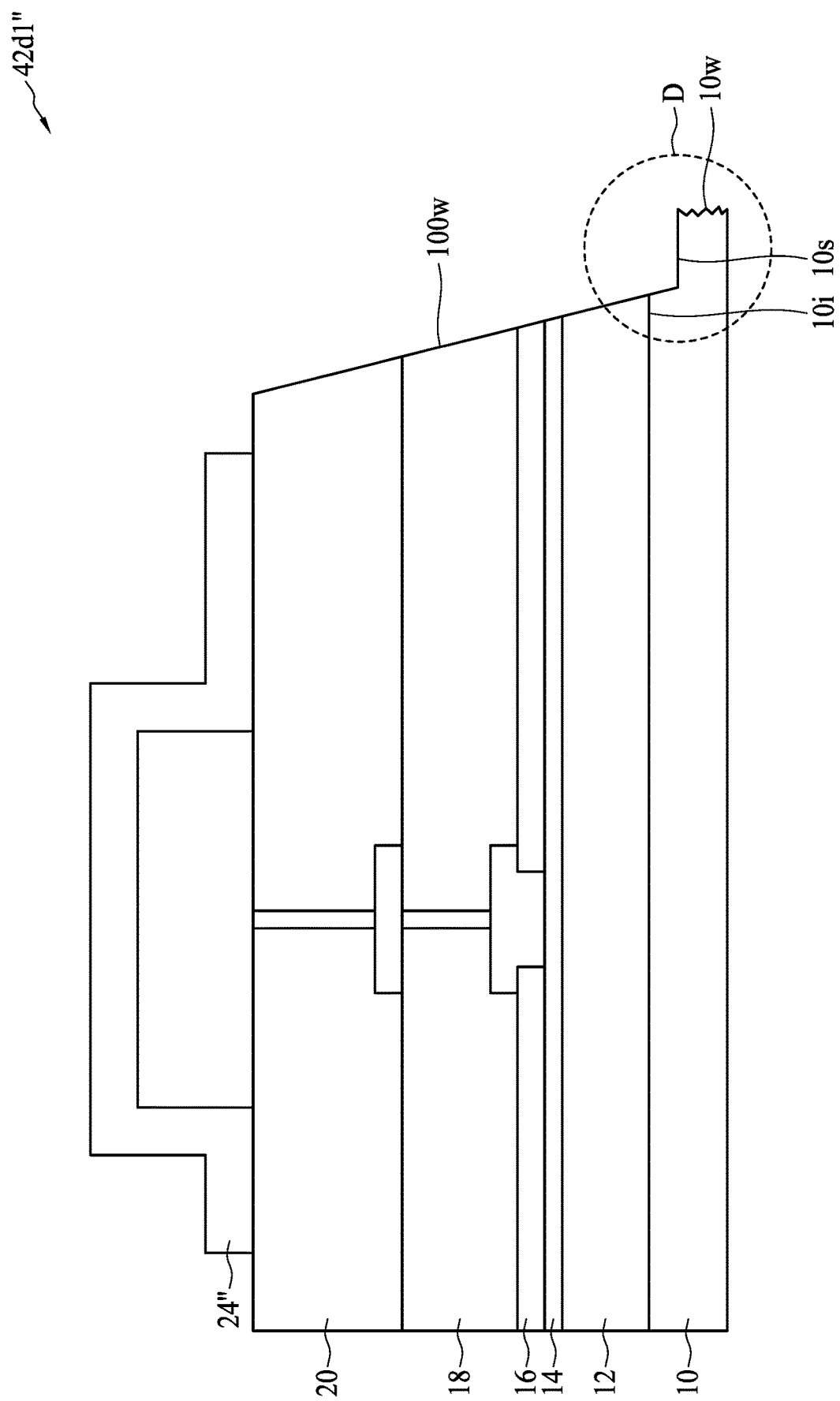
FIG. 3E shows a portion of a semiconductor device according to certain embodiments of the present disclosure.

FIG. 3E shows a portion of a semiconductor device according to certain embodiments of the present disclosure. FIG. 3E shows a portion of the semiconductor device 42*d*1". The semiconductor device 42*d*1' can be singulated from the wafer 40.

Referring to the dotted circle D shown in FIG. 3E, the blade or the saw used to singulate the semiconductor device 42*d*1' may introduce uneven edges to the substrate 10. The substrate 10 can have a relatively rough surface 10*w* adjacent to the interface 10*i*. The substrate 10 can have a relatively uneven surface 10*w* adjacent to the interface 10*i*. The substrate 10 can have a relatively rough surface 10*w* facing opposite the interface 10*i*. The substrate 10 can have a relatively uneven surface 10*w* facing opposite the interface 10*i*. The substrate 10 can have a relatively rough surface 10*w* facing opposite the sidewall 100*w*.

Figure 4A:
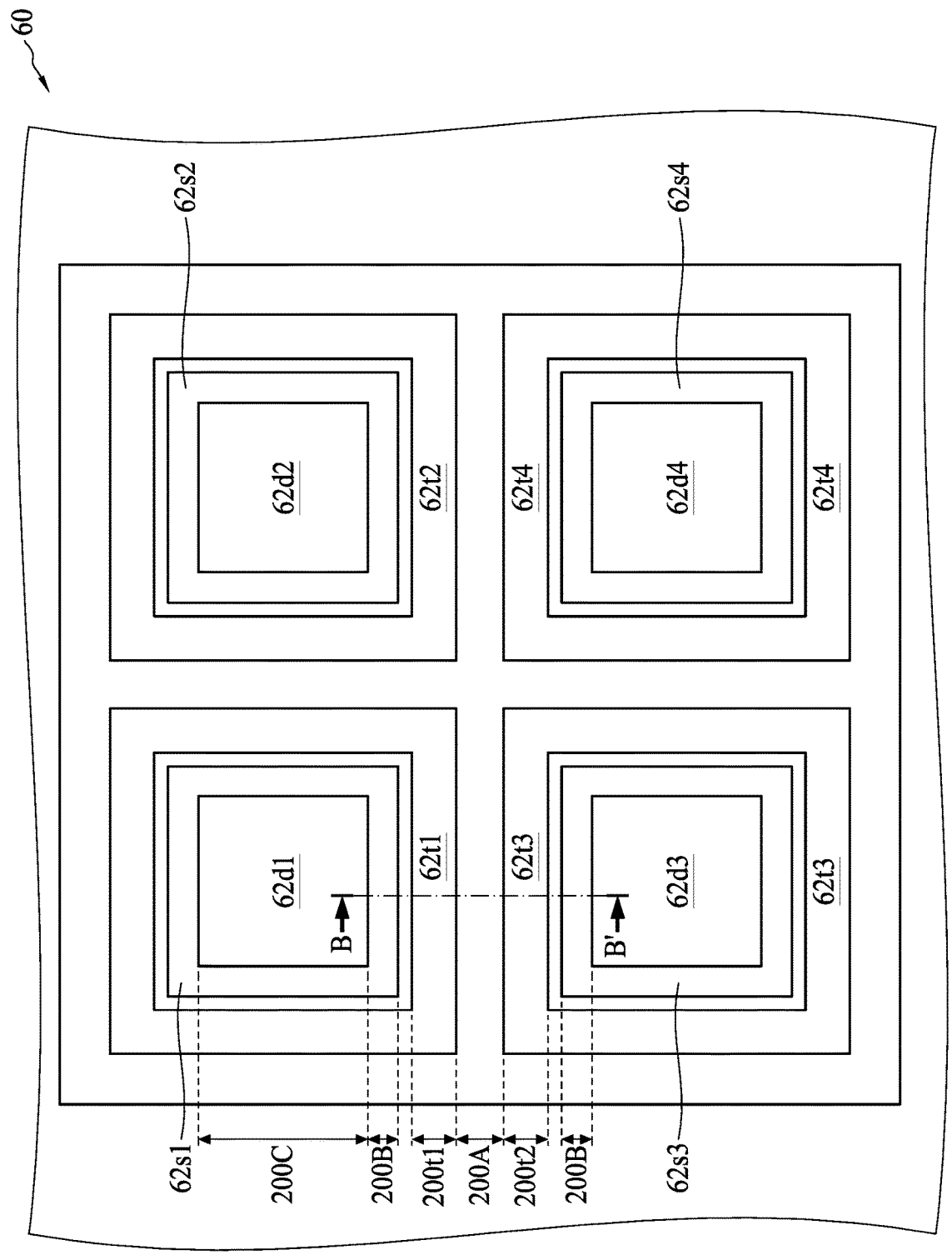
FIG. 4A shows a simplified schematic diagram of a plan view of a portion of a wafer comprising a plurality of semiconductor devices and a pre-dicing trench according to certain comparative embodiments of the present disclosure.

FIG. 4A shows a simplified schematic diagram of a plan view of a portion of a wafer comprising a plurality of semiconductor devices and a pre-dicing trench according to certain comparative embodiments of the present disclosure.

Referring to FIG. 4A, the wafer 60 includes semiconductor devices 62*d*1, 62*d*2, 62*d*3 and 62*d*4. The semiconductor device 62*d*1 includes a seal ring 62*s*1 surrounding the peripherals of the semiconductor device 62*d*1. The semiconductor device 62*d*2 includes a seal ring 62*s*2 surrounding the peripherals of the semiconductor device 62*d*2. The semiconductor device 62*d*3 includes a seal ring 62*s*3 surrounding the peripherals of the semiconductor device 62*d*3. The semiconductor device 62*d*4 includes a seal ring 62*s*4 surrounding the peripherals of the semiconductor device 62*d*4.

A recess 62*t*1 surrounds the peripherals of the seal ring 62*s*1. A recess 62*t*2 surrounds the peripherals of the seal ring 62*s*2. A recess 62*t*3 surrounds the peripherals of the seal ring 62*s*3. A recess 62*t*4 surrounds the peripherals of the seal ring 62*s*4.

FIG. 4B is a simplified schematic cross-sectional view of a portion of a semiconductor wafer according to certain comparative embodiments of the present disclosure.

FIG. 4B shows a semiconductor structure 200 according to certain comparative embodiments of the present disclosure. The semiconductor structure 200 of FIG. 4B can be a cross-sectional view of a portion of the wafer 60 along the dotted line B-B' of FIG. 4A.

The semiconductor structure 200 includes regions 200A, 200B and 200C. The region 200A can be referred to as a scribe line or a scribe region. Semiconductor devices included in the semiconductor structure 200 (not shown) can be separated or singulated by cutting/sawing the semiconductor structure 200 along the region 200A. The region 200B is a seal ring, and the region 200C is an area where the semiconductor devices (not shown) located and can be referred to as an active device area.

The semiconductor structure 200 includes a recess 200*t*1 disposed adjacent to one side of the region 200A and a recess 200*t*2 disposed adjacent to the other side of the region 200A.

Referring to the region 200A of FIG. 4B, this region of the semiconductor structure 200 includes multi-layered structures. Therefore, the blade or the saw used in the singulation process will inevitably pass through several interfaces. For example, cutting/sawing along the region 200A will pass through the interface 10*i* between the substrate 10 and the group III-V layer 12. Since there is a lattice mismatch between the substrate 10 and the group III-V layer 12, cutting through the interface 10*i* will tend to cause cracks or delamination. In accordance with the embodiments shown in FIG. 4B, a crack 12*c* may be formed from the interface 10*i* and propagate toward the direction of the regions 200B and 200C. The cracks or delamination resulting from cutting/sawing along the region 200A will adversely affect the yield of the overall manufacturing process.

Referring to both FIGS. 4A and 4B, the recess 62*t*1 shown in FIG. 4A may correspond to the recess 200*t*1 shown in FIG. 4B. The recess 62*t*3 shown in FIG. 4A may correspond to the recess 200*t*2 shown in FIG. 4B. The seal rings 62*s*1 and 62*s*3 shown in FIG. 4A may correspond to the regions 200B shown in FIG. 4B. The semiconductor devices 62*d*1 and 62*d*3 shown in FIG. 4A may be located in the region 200C of FIG. 4B.

In some embodiments, the recess 200*t*1, the region 200A and the recess 200*t*2 have a total width of around 80 μm. In some embodiments, the recess 200*t*1, the region 200A and the recess 200*t*2 have a total width of around 120 μm. In some embodiments, the total width of the recess 200*t*1, the region 200A and the recess 200*t*2 is in a range from 80 μm to 120 μm.

Due to the width of the recess 200*t*1, the region 200A and the recess 200*t*2, the effective area used of the wafer 60 shown in FIG. 4A can be less than that of the wafer 40 shown in FIG. 3A. In some embodiments, the effective area used of the wafer 60 can be 30% less than that of the wafer 40. In some embodiments, the effective area used of the wafer 60 can be upto 40% less than that of the wafer 40. The effective area used here refers to the percentage of the total area of the wafer occupied by the semiconductor device.

Figure 4C:
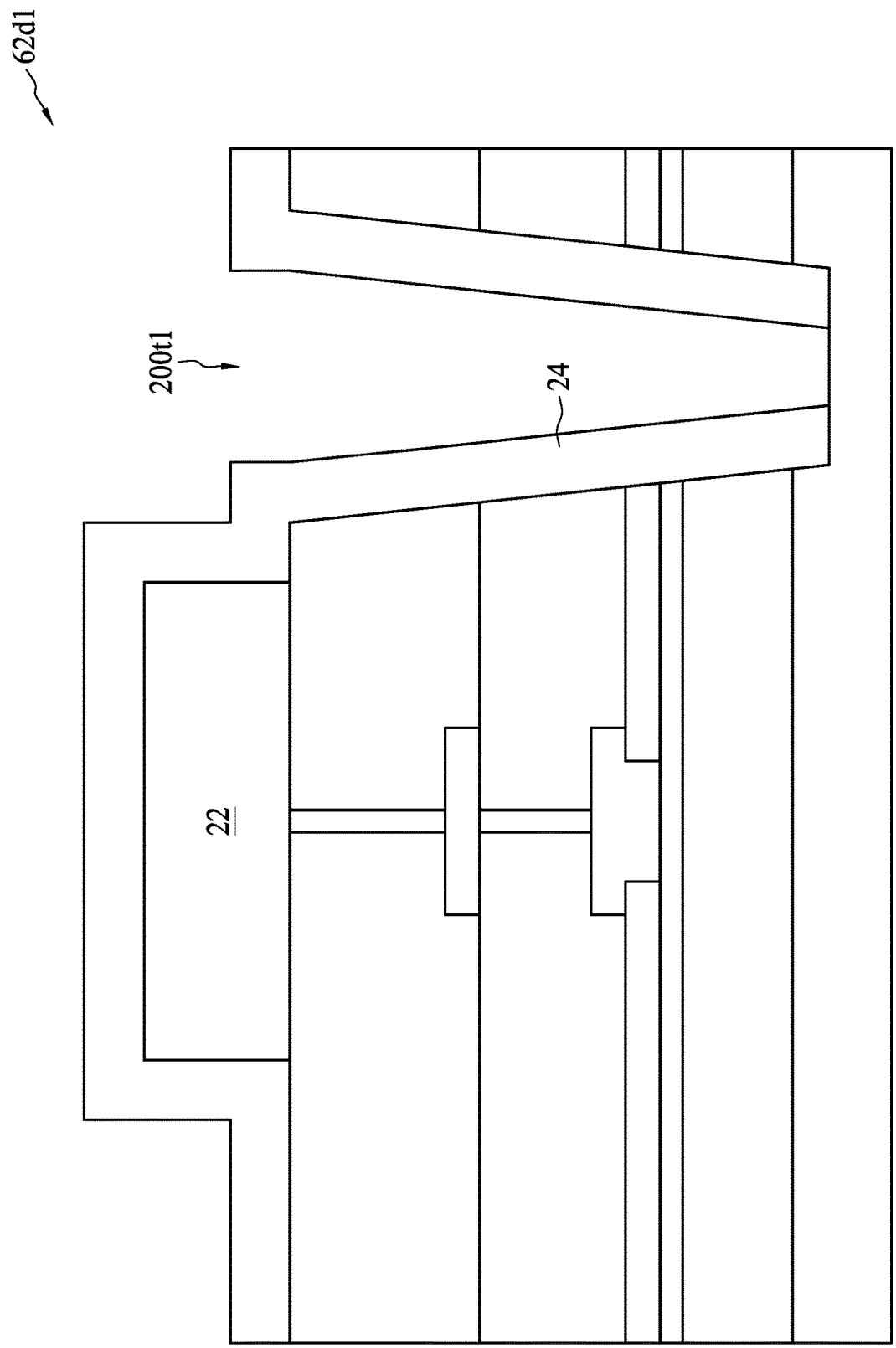
FIG. 4C shows a portion of a semiconductor device according to certain comparative embodiments of the present disclosure.

FIG. 4C shows a portion of a semiconductor device according to certain comparative embodiments of the present disclosure.

FIG. 4C shows a portion of the semiconductor device 62*d*1. The semiconductor device 62*d*1 can be singulated from the wafer 60. In some embodiments, the semiconductor device 62*d*1 can be singulated from the wafer 60 using a blade, a saw, or laser. Referring to FIG. 4C, the semiconductor device 62*d*1 includes a recess 200*t*1. The passivation layer 24 may extend toward the recess 200*t*1 and cover the sidewall of the recess 200*t*1.

As used herein, spatially relative terms, such as "beneath," "below," "lower," "above," "upper," "lower,"

"left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A nitride-based semiconductor structure, comprising:
   a substrate;
   a group 111-V nitride layer disposed on the substrate;
   a dielectric layer disposed on the group 111-V nitride layer;
   a first sidewall extending from the dielectric layer onto the substrate;
   a second sidewall disposed opposite the first sidewall, and extending from the dielectric layer onto the substrate, wherein the first sidewall and the second sidewall define a recess, and wherein a base of the recess is the substrate;
   a passivation layer extending over the nitride-based semiconductor structure and into the recess, the passivation layer covering the first and second sidewalls and a portion of the substrate; and
   an opening formed in the passivation layer exposing a portion of the substrate, the opening defining an alignment mark for pre-dicing;
   wherein the passivation layer comprises a first portion and a second portion disposed on a surface of the substrate, and the opening is defined by the first portion and the second portion, wherein the first portion covers a first corner of the recess, and the second portion covers a second corner of the recess; and
   the first portion and the second portion extend on the surface of the substrate, the first portion has a first surface facing opposite to the first sidewall, the second portion has a second surface facing opposite to the second sidewall, and the first surface and the second surface are smooth and perpendicular to the surface of the substrate.

2. The nitride-based semiconductor structure according to claim 1, wherein an exposed portion of the substrate is not coplanar with an interface between the substrate and the group 111-V nitride layer.

3. The nitride-based semiconductor structure according to claim 1, wherein the surface of the substrate and the first sidewall define a first angle, wherein the first angle is in a range of 90 degrees to 150 degrees.

4. A method for fabricating the nitride-based semiconductor device of claim 1, comprising:
   providing a semiconductor structure having a substrate, a group 111-V nitride layer and a dielectric layer;
   forming a recess extending from the dielectric layer to the substrate;
   forming a metal layer covering the dielectric layer and the recess;
   forming a photoresist layer on the metal layer;
   performing a first photolithography process and a second photolithography process on the photoresist layer; wherein
   the focus setting of the first photolithography process is different from the focus setting of the second photolithography process;
   forming a patterned metal layer; and
   forming a passivation layer covering the patterned metal layer, wherein the passivation layer covers sidewalls of the recess and a portion of a surface of the substrate;
   wherein the passivation layer comprises a first portion and a second portion disposed on the surface of the substrate, an opening is formed in the passivation layer exposing a portion of the substrate and defined by the first portion and the second portion, the first portion covers a first corner of the recess, and the second portion covers a second corner of the recess; and
   the first portion and the second portion extend on the surface of the substrate, the first portion has a first surface facing opposite to the first sidewall, the second portion has a second surface facing opposite to the second sidewall, and the first surface and the second surface are smooth and perpendicular to the surface of the substrate;
   performing a singulation process at the opening formed in the passivation layer.

5. The method according to claim 4, wherein the focus setting of the first photolithography process is selected in accordance with the top of the recess.

6. The method according to claim 4, wherein the focus setting of the second photolithography process is selected in accordance with the bottom of the recess.

* * * * *